United States Patent
Ching, Jr. et al.

(10) Patent No.: US 10,734,311 B2
(45) Date of Patent: Aug. 4, 2020

(54) HYBRID LEAD FRAME FOR SEMICONDUCTOR DIE PACKAGE WITH IMPROVED CREEPAGE DISTANCE

(71) Applicant: NXP USA, Inc., Austin, TX (US)

(72) Inventors: Mariano Layson Ching, Jr., Tianjin (CN); Burton Jesse Carpenter, Austin, TX (US); Lidong Zhang, Tianjin (CN); Kendall Dewayne Phillips, Driftwood, TX (US); Quan Chen, Tianjin (CN); Meng Kong Lye, Shah Alam (MY)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/240,901

(22) Filed: Jan. 7, 2019

(65) Prior Publication Data
US 2020/0203262 A1    Jun. 25, 2020

(30) Foreign Application Priority Data
Dec. 25, 2018 (CN) .......................... 2018 1 1590346

(51) Int. Cl.
| | | |
|---|---|---|
| *H01L 23/49* | (2006.01) | |
| *H01L 23/495* | (2006.01) | |
| *H01L 23/31* | (2006.01) | |

(52) U.S. Cl.
CPC .... *H01L 23/49541* (2013.01); *H01L 23/3121* (2013.01); *H01L 23/49503* (2013.01); *H01L 23/49568* (2013.01)

(58) Field of Classification Search
CPC ...................... H01L 2224/45144; H01L 33/62
See application file for complete search history.

(56) References Cited

U.S. PATENT DOCUMENTS

| | | | |
|---|---|---|---|
| 3,907,394 A * | 9/1975 | Barnes | H01R 13/629 439/376 |
| 4,768,077 A | 8/1988 | Scherer | |
| 8,487,417 B2 | 7/2013 | Balakrishnan et al. | |
| 9,041,172 B1 | 5/2015 | Niu et al. | |
| 10,037,935 B1 * | 7/2018 | Pang | H01L 21/565 |
| 10,365,303 B2 * | 7/2019 | Yue | G01R 1/203 |
| 2008/0135995 A1 * | 6/2008 | Li | H01L 23/4952 257/676 |
| 2009/0051017 A1 | 2/2009 | Wee et al. | |
| 2011/0097854 A1 * | 4/2011 | Fujishima | H01L 21/4835 438/123 |
| 2014/0306330 A1 * | 10/2014 | Williams | H01L 23/49541 257/675 |

(Continued)

*Primary Examiner* — Caridad Everhart
*Assistant Examiner* — Ankush K Singal

(57) ABSTRACT

Embodiments of packaged semiconductor devices and lead frames for such devices are provided, such as a lead frame including: a row of lead fingers, wherein an outer end of each lead finger is connected to a leaded side of the lead frame; a package body perimeter that indicates placement of a package body of the packaged semiconductor device, wherein an inner end of each lead finger falls within the package body perimeter; a retention tab that protrudes from an interior edge of a non-leaded side of the lead frame, wherein the retention tab falls outside of the package body perimeter; and a non-conductive tie bar structure attached to the retention tab, wherein the non-conductive tie bar structure falls within the package body perimeter.

20 Claims, 13 Drawing Sheets

(56) References Cited

U.S. PATENT DOCUMENTS

2015/0311144 A1* 10/2015 Williams ............ H01L 23/4952
  257/675
2016/0148859 A1* 5/2016 Muto ...................... B60L 3/003
  257/676
2018/0040487 A1* 2/2018 Takahashi ......... H01L 23/49551

* cited by examiner

US 10,734,311 B2

HYBRID LEAD FRAME FOR SEMICONDUCTOR DIE PACKAGE WITH IMPROVED CREEPAGE DISTANCE

BACKGROUND

Field

This disclosure relates generally to integrated circuit packaging, and more specifically, to minimizing creepage distance in a lead frame-based semiconductor die package.

Related Art

A semiconductor die is a small integrated circuit (IC) formed on a semiconductor wafer, such as a silicon wafer. Such a die is typically cut from the wafer and packaged using a lead frame. The lead frame is a metal frame that supports the die and provides external electrical connections for the packaged die. The lead frame usually includes a flag (or die pad) and lead fingers (or leads). The semiconductor die is attached to the flag. Bond pads on the die are electrically connected to the leads of the lead frame with bond wires. The die and bond wires are covered with an encapsulant to form a semiconductor die package. The leads either project outwardly from the encapsulation or are at least flush with the encapsulation so they can be used as terminals, allowing the packaged die to be electrically connected to other devices or a printed circuit board (PCB).

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Figure 1:
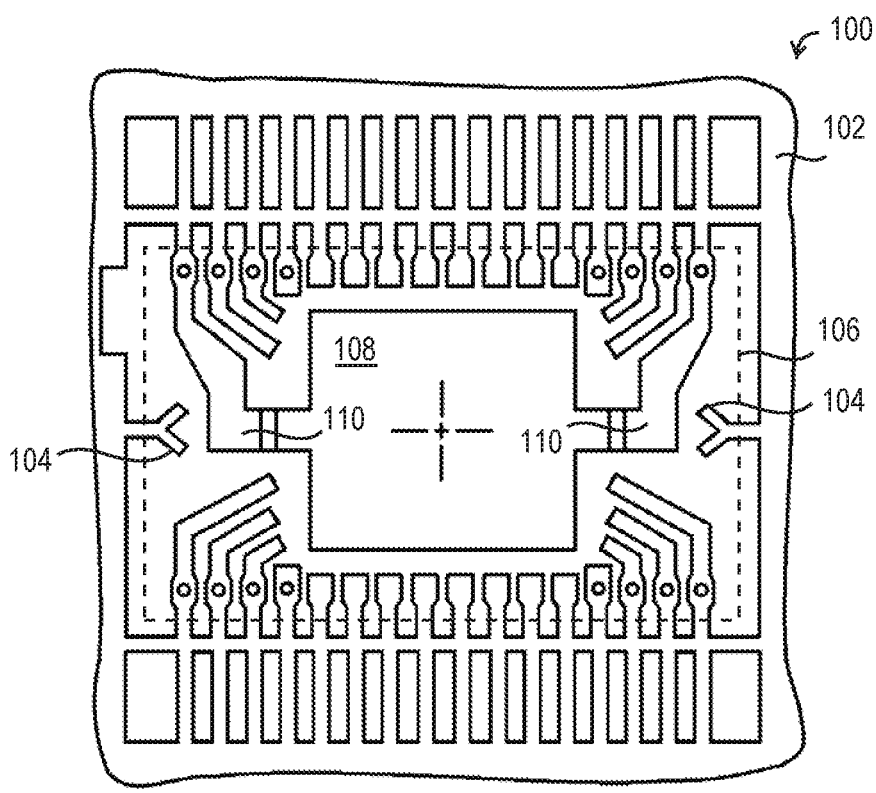
FIG. 1, FIG. 2, and FIG. 3 illustrate block diagrams depicting various views of a semiconductor die package built on an example lead frame.

During an encapsulation process to form a semiconductor die package on a lead frame, the lead frame is placed within a mold cavity of mold tooling, such as a mold chase that closes around the lead frame. Liquid encapsulant material is injected into the mold cavity and cured to form a package body of the semiconductor die package. Often, the lead frame includes metal tie bar structures that are embedded within the package body to hold the package steady during a subsequent trim and form process to trim away and shape the leads of the lead frame, where the metal tie bar structures are cut away from the surrounding lead frame when the package is singulated from an array of packages formed on an array of lead frames. Example tie bar structures are shown in a top-down view of an example lead frame 100 in FIG. 1. Lead frame 100 includes a die pad 108 for a semiconductor die, a pair of die pad connection arms 110 that connect the die pad 108 to the surrounding frame structure 102 of the lead frame 100, and a pair of tie bar structures 104 that extend toward the die pad 108 from the surrounding frame structure 102. As shown, the tie bar structures 104 are placed on opposing ends of the lead frame on non-leaded edges of the lead frame 100 (e.g., edges of the lead frame 100 that do not include leads). A package body perimeter 106 (illustrated as a box with a dotted line) laterally surrounds the die pad 108 and indicates where a package body will be formed on the lead frame 100. The tie bar structures 104 extend into the package body perimeter 106 and are surrounded by the encapsulant material of the package body. The lead frame 100, including the tie bar structures 104, is made from a conductive material, such as copper.

Figure 2:
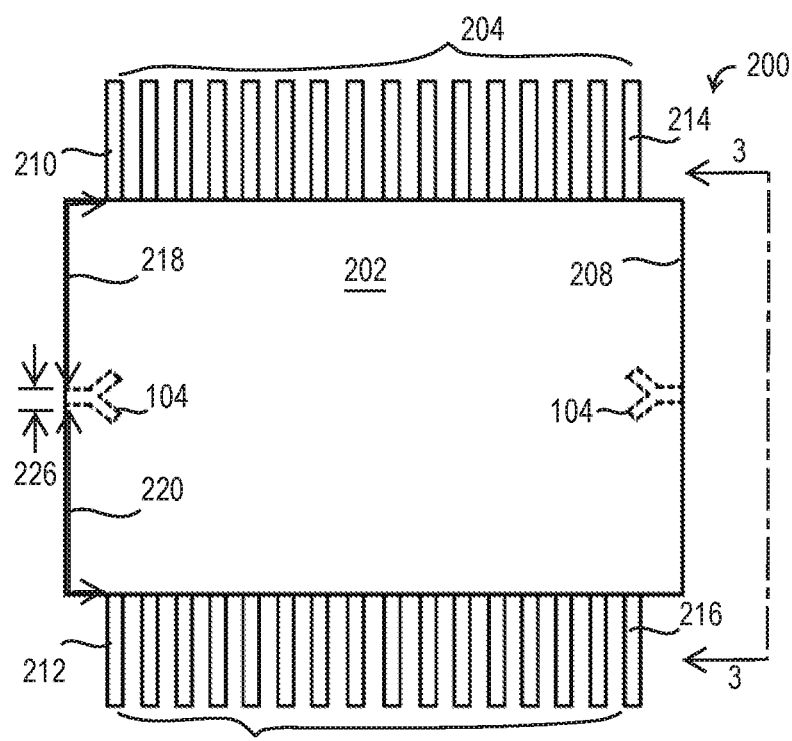

FIG. 2 shows a top-down view of a resulting semiconductor die package 200 after the encapsulation process forms a package body 202 on the lead frame 100 and a subsequent trim and form process is performed, which leaves two sets of leads 204 and 206 that extend outward from opposing sides of the package body 202. After the trim and form process, the package 200 is singulated from the surrounding frame structure 102. It is noted that the package body 202 has an outer lateral edge or surface, indicated as package body outline 208, which corresponds to the package body perimeter 106 of FIG. 1. Portions of the tie bar structures 104 that remain within the package body 202 after singulation are shown in dotted lines.

The semiconductor die package 200 needs to meet a minimum creepage distance required by industry standards. Creepage distance is the shortest path between a pair of conductors along a surface of solid insulation material. The necessary creepage distance may vary for a given device, depending on the application voltage, environment, and material selection of the device. For example, international industry standards provide a minimum creepage distance of 8.0 mm in devices for certain high voltage applications. Creepage distances that are shorter than the minimum creepage distance may give rise to current tracking or "creeping" along the surface of the solid insulation material between two leads at different electrical potentials, which in turn may cause breakdown of the insulation material between the two leads, which can be especially problematic in semiconductor die packages for high voltage applications.

Figure 3:
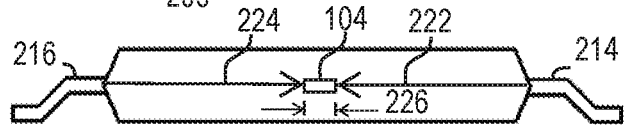

In order for the semiconductor die package 200 to be adequately designed for high voltage applications, the outermost leads of the sets of leads 204 and 206 need to be separated by a minimum creepage distance, such as 8.0 mm, to achieve adequate high voltage isolation between the outermost leads, where the outermost leads on one side of the package 200 may be at a high potential and the outermost leads on the other side of the package 200 may be at a low potential. However, the remnants of the tie bar structures 104 (also referred to as tie bar remnants 104) that remain at the surface of the package body 202 are conductors that reduce the creepage distance. Since the tie bar structures 104 are electrically floating (e.g., not connected to either the high potential or the low potential), the creepage distance is reduced by the width 226 of the tie bar remnants 104 intervening in the respective creepage path measured between the outermost leads (e.g., the remnants act as intermediate conductors between the outermost leads). As shown in FIG. 2, creepage distance between outermost lead 210 and outermost lead 212 is equal to the distance 218 along package body outline 208 (or along the surface of package body 202) between outermost lead 210 and tie bar remnant 104, plus the distance 220 along package body outline 208 between tie bar remnant 104 and outermost lead 212. Put another way, the creepage distance between outermost leads 210 and 212 is the shortest path measured between the outermost leads 210 and 212 along package body outline 208, minus the width 226 of the tie bar remnant 104. FIG. 3 also shows a head-on end view of the resulting semiconductor die package 200, similarly showing a creepage distance between outermost leads 214 and 216 being equal to the combination of distances 222 and 224 respectively measured from the outermost leads 214 and 216 to the tie bar remnant 104 (or the shortest path between leads 214 and 216 minus the width 226 of tie bar remnant 104). In other words, even though the outermost leads 210 and 212 (or leads 214 and 216) may be physically separated by at least 8.0 mm of solid insulation material, that distance is reduced by the presence of the intervening remnants of tie bar structures 104 between the outermost leads, resulting in a creepage distance that fails to meet the required minimum creepage distance.

Figure 4:
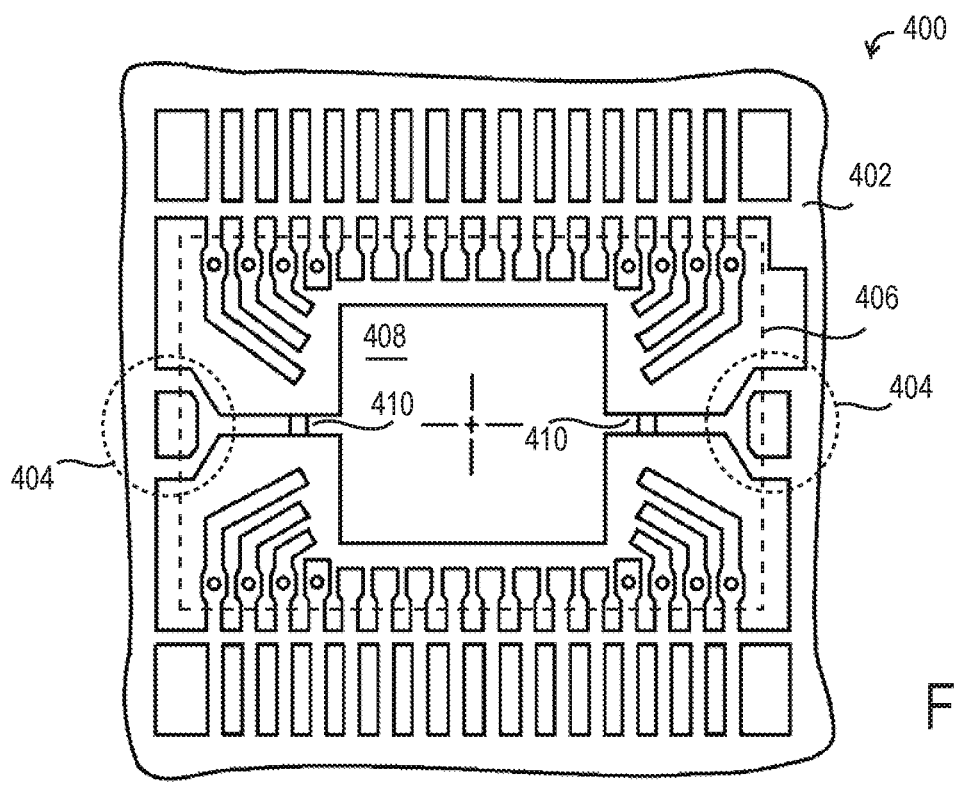
FIG. 4, FIG. 5, and FIG. 6 illustrate block diagrams depicting various views of a semiconductor die package built on another example lead frame.

FIG. 4 also illustrates an example lead frame having a more serious problem with creepage distance. Lead frame 400 includes a die pad 408 for a semiconductor die and a pair of die pad connection arms 410 that connect the die pad 408 to the surrounding frame structure 402. In this example, the die pad connection arms 410 are connected to a pair of tie bar structures 404 on opposing ends of the lead frame on non-leaded edges of the lead frame 400 (e.g., edges of the lead frame 400 that do not include leads). A package body perimeter 406 (illustrated as a box with a dotted line) laterally surrounds the die pad 408 and indicates where a package body will be formed on the lead frame 400. The tie bar structures 404 extend into the package body perimeter 406 and are surrounded by the encapsulant material of the package body. The lead frame 400, including the tie bar structures 404, is made from a conductive material, such as copper. It is noted that the tie bar structures 404 each include a respective slot, within which fits a dam block or similar structure on the mold tooling. For example, when the lead frame 400 is placed within the mold cavity of the mold tooling, a dam block fits into the slot of structure 404 and remains outside of the perimeter 406. When the encapsulation material is cured, the dam block is adjacent to the resulting package body, preventing the encapsulation material from extending past the intended package body perimeter 406 at the tie bar structure 404.

Figure 5:
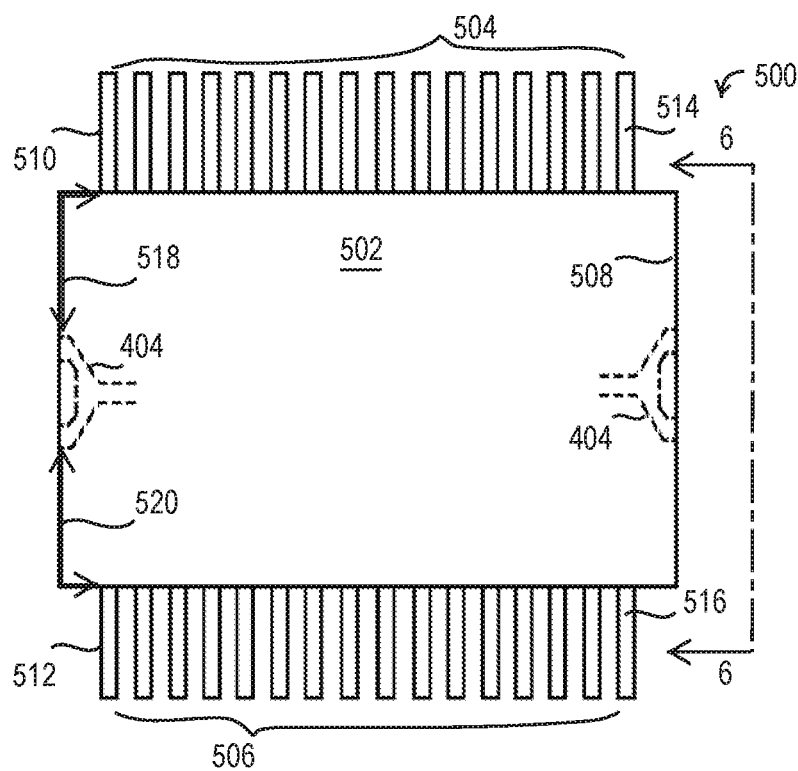

FIG. 5 shows a top-down view of a resulting semiconductor die package 500 after the encapsulation process forms a package body 502 on the lead frame 400 and a subsequent trim and form process is performed, which leaves two sets of leads 504 and 506 that extend outward from opposing sides of the package body 502. In this structure, it is typical for the die pad 408, and therefore tie bars remnants 404, to be electrically connected to either lead set 504 or lead set 506. After the trim and form process, the package 500 is singulated from the surrounding frame structure 402. The package body 502 has an outer lateral edge or surface, indicated as package body outline 508, which corresponds to the package body perimeter 406 of FIG. 4. Portions of the tie bar structures 404 that remain within the package body 502 after singulation are shown in dotted lines.

Figure 6:
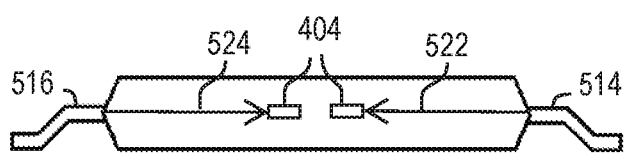

In order for the semiconductor die package 500 to be adequately designed for high voltage applications, the outermost leads of the sets of leads 504 and 506 need to be separated by a minimum creepage distance to achieve adequate high voltage isolation. However, the tie bar remnants 404 that remain at the surface of the package body 502 are conductors that reduce the creepage distance. Since the remnants 404 are possibly electrically connected to either lead set 504 or lead set 506, the creepage distance is actually measured from the outermost leads that are not electrically connected to the die pad to a closest end of tie bar remnants 404. As shown in FIG. 5, creepage distance 518 is measured between the outermost lead 510 and the closest tie bar remnant 404 along package body outline 508 (or the surface of package body 502), and creepage distance 520 is measured between the outermost lead 512 and the closest tie bar remnant 404 along package body outline 508. FIG. 6 also shows a head-on end view of the resulting semiconductor die package 500, similarly showing creepage distances 522 and 524 respectively measured between the closest tie bar remnant 404 and outermost leads 514 and 516. In other words, even though the outermost leads 510 and 512 (or leads 514 and 516) may be physically separated by at least 8.0 mm of solid insulation material, that distance is practically halved by the presence of the intervening remnants of tie bar structures 504, resulting in a creepage distance that fails to meet the minimum creepage distance requirement.

The present disclosure provides for a hybrid lead frame including a conductive lead frame having non-conductive tie bar structures. The tie bar structures of the present disclosure are made from a non-conductive material, such as structures made of plastic, rubber, polymer, or thermal tape. The lead frame of the present disclosure includes at least one pair of retention tabs extending from an edge of the lead frame, where the retention tabs and the lead frame are made from a same conductive material. The retention tabs remain outside of the package body perimeter, with a non-conductive tie bar structure attached to the pair of retention tabs that extends into the package body perimeter, which becomes embedded in the package body during the encapsulation process. In some embodiments, ends of the pair of retention tabs are directly or immediately adjacent to the package body perimeter (e.g., tangential to the package body perimeter), while in other embodiments, ends of the pair of retention tabs are separated from the package body perimeter by an offset distance. One pair of retention tabs may extend from one edge of the lead frame, while another pair of retention tabs may extend from an opposing edge of the lead frame. In some embodiments, these opposing pairs of retention tabs may be located on opposing non-leaded edges of the lead frame. The non-conductive tie bar structures hold the package steady during a trim and form process, where the non-conductive tie bar structures are cut from the lead frame when the package is singulated. Any remnants of the non-conductive tie bar structure remaining at a surface of the package body do not reduce the creepage distance between outermost leads of the resulting semiconductor die package. The elimination of metal tie bar structures from the hybrid lead frame ensures that the creepage distance between the outermost leads of the resulting semiconductor die package is not reduced by any intervening remnants of the metal tie bar structures.

EXAMPLE EMBODIMENTS

Figure 7A:
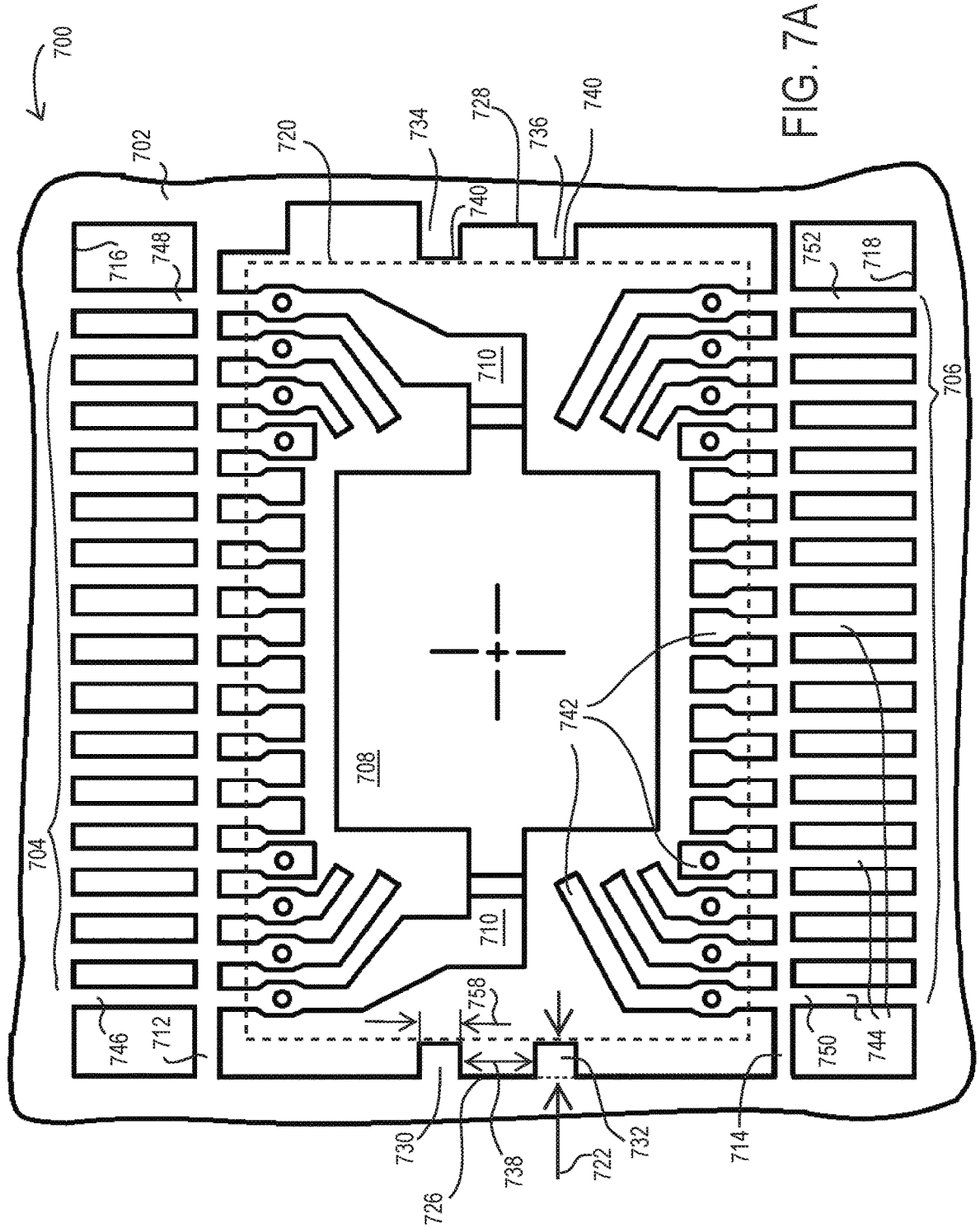
FIG. 7A, FIG. 7B, FIG. 7C, and FIG. 7D illustrate block diagrams depicting top-down views of example conductive lead frames of a hybrid lead frame in which the present disclosure is implemented, according to some embodiments.

FIG. 7A illustrates a top-down view of an example lead frame 700 in which the present disclosure is implemented. The lead frame 700 shown implements a small outline integrated circuit (SOIC) lead frame design, although the hybrid lead frame disclosed herein may be differently shaped in other embodiments (e.g., dual in-line package (DIP), small outline package (SOP), and the like). The unit lead frame 700 may be one of a number of unit lead frames in a lead frame array.

Lead frame 700 includes a die pad 708 and two sets of leads 704 and 706 that project outward from opposing sides of the die pad 708, which will extend from opposite sides of a semiconductor die package formed on the lead frame 700, as further discussed below in connection with FIG. 18-21. Leads 704 and 706 may also be characterized as active leads because they are active (e.g., convey signals at various voltage potentials) when the semiconductor die package is powered during operation. The set of leads 706 includes a row of lead fingers, where each lead finger has an inner end 742 that is laterally separated from the die pad 708 and an outer end 744 that is connected to an interior edge 718 of a surrounding frame structure 702 of the lead frame 700. Edge 718 may also be referred to as an interior edge of a leaded side of the lead frame 700 (e.g., shown as the bottom side of lead frame 700 that includes leads), or as a leaded edge. Leads 750 and 752 are the outermost leads of the set of leads 706, and can also be characterized as the first and last lead fingers of the (bottom) row of lead fingers. The set of leads 706 are connected to one another by a dam bar 714.

The set of leads 704 also includes a row of lead fingers having inner ends 742 laterally separated from the die pad 708 and outer ends 744 that are connected to another interior edge 716 of the surrounding frame structure 702, where edge 716 is opposite edge 718. Edge 716 may also be referred to as an interior edge of a leaded side of the lead frame 700 (e.g., shown as the top side of lead frame that includes leads), or as a leaded edge. The set of leads 704 also include a pair of leads 746 and 748 that are connected to the die pad 708 via a pair of die pad connection arms 710. The pair of leads 746 and 748 are also the outermost leads of the set of leads 704 and are located on either side of the (top) row of lead fingers. The set of leads 704 are connected to one another by a dam bar 712.

In the embodiment shown, each set of leads 704 and 706 include a same number of leads, although the number of leads in each set of leads 704 and 706 may be unequal in other embodiments. Also in the embodiment shown, the (top) set of leads 704 has two fewer lead fingers than the (bottom) set of leads 706 to make room for the pair of leads 746 and 748 that are connected to die pad connection arms 710. However, the number of lead fingers in each set of leads 704 and 706 may include an equal number of lead fingers in other embodiments. It is also noted that dam bars 712 and 714 are shown as also being connected to the frame structure 702, but may not be so connected in other embodiments.

The die pad 708 is centered within the frame structure 702 (e.g., as shown by the horizontal and vertical midlines of the lead frame that are centered within die pad 708) and is laterally surrounded by a package body perimeter 720, which is illustrated with a broken line laterally separated from the edges of the die pad 708. The package body perimeter 720 indicates where a corresponding edge of the package body will be formed during encapsulation. The inner ends 742 of the leads 704 and 706 fall within the package body perimeter 720 and form electrical connection contact areas to which a semiconductor die is electrically connected. The die pad connection arms 710 also fall within the package body perimeter 720. The outer ends of the leads 704 and 706, which include outer ends 744 of the lead fingers and leads 746 and 748, fall outside of the package body perimeter 720 and will extend from outer edges of the package body, once the package body is formed during encapsulation. After a subsequent trim and form process and singulation, the leads 704 and 706 that extend from the outer edge of the package body form external electrical connections for the semiconductor die.

The lead frame 700 also includes a number of retention tabs 730, 732, 734, and 736. A pair of retention tabs 730 and 732 extend from an interior edge 726 of the frame structure 702, where edge 726 is generally perpendicular to edges 716 and 718. Edge 726 may also be referred to as an interior edge of a non-leaded side of the lead frame 700 (e.g., shown as the left side of lead frame that does not include leads), or as a non-leaded edge. Another pair of retention tabs 734 and 736 extend from another interior edge 728 of the frame structure 702, where edge 728 is opposite edge 726 (and is also perpendicular to edges 716 and 718). Edge 728 may also be referred to as an interior edge of a non-leaded side (e.g., shown as the right side of lead frame that does not include leads), or as a non-leaded edge. A non-conductive tie bar is attached to a pair of retention tabs, examples of which are discussed below in connection with FIGS. 8-13 and 16A-16D.

Each retention tab extends from a respective one of inner (or non-leaded) edges 726 and 728 toward die pad 708 to an outer edge 740 of the retention tab that is parallel to a closest edge of the package body perimeter 720. The retention tabs fall outside of the package body perimeter 720 (and remain outside of the resulting package body formed within perimeter 720 during encapsulation). In the embodiment shown, the outer edges 740 of the retention tabs are immediately adjacent to the package body perimeter 720. Each retention tab has a width 758, and has some length that can be measured from the respective non-leaded edge of the frame structure 702 to the tab's outer edge 740. In FIG. 7A, the retention tabs have a length 722 that is shorter than the distance between a non-leaded edge of the frame structure 702 and the edge of the package body perimeter 720.

Figure 7D:
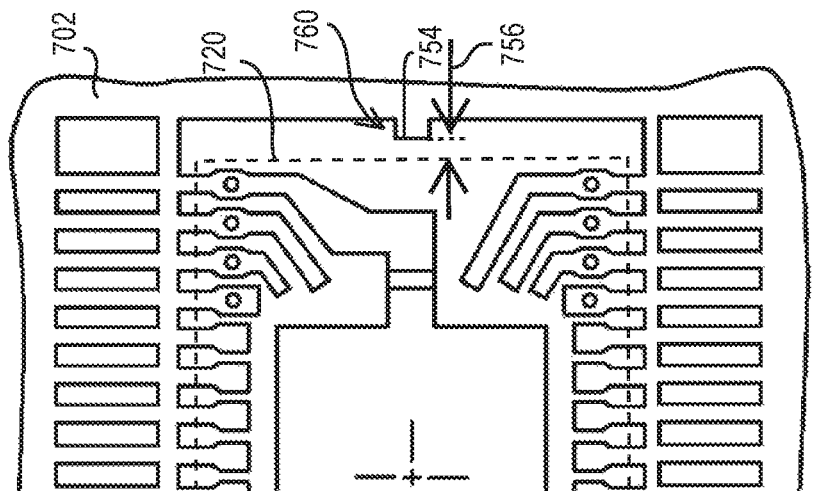
Figure 7C:
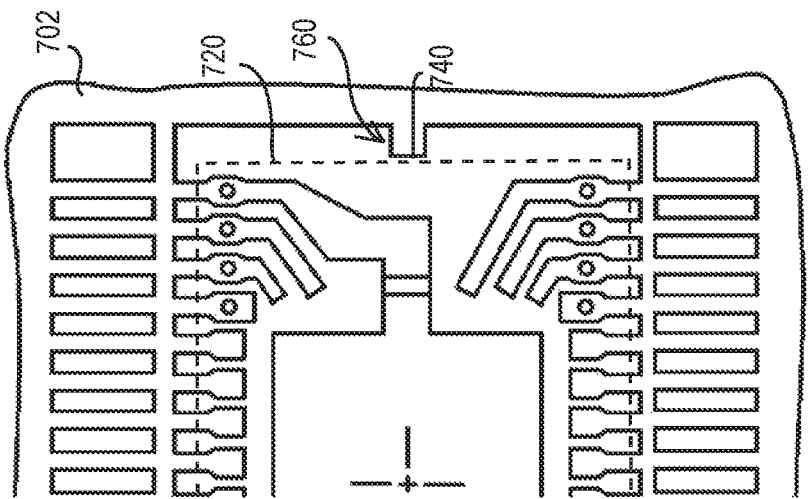
Figure 7B:
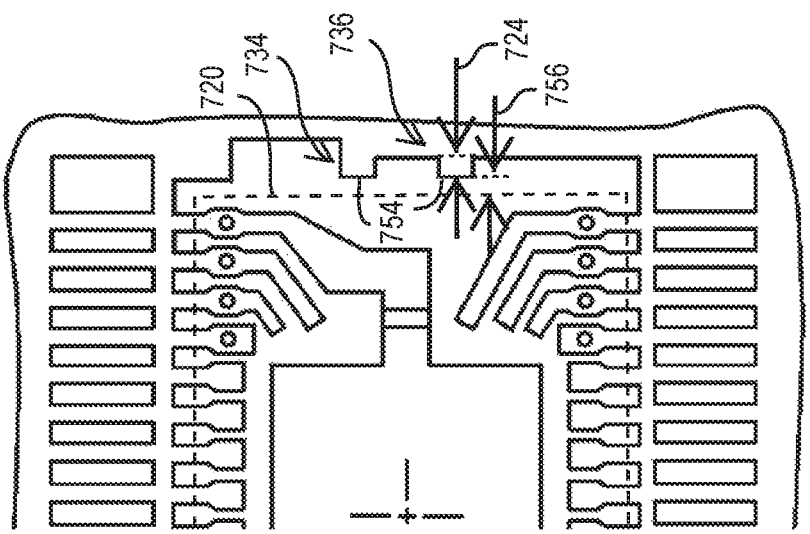

Other embodiments of the retention tabs are shown in FIGS. 7B, 7C, and 7D. It is noted that, for simplicity's sake, each of FIGS. 7B, 7C, and 7D shows one or more retention tabs extending from one half of an example hybrid lead frame that may be laterally symmetrical about a central vertical line (e.g., the vertical midline shown in the center of the die pad), where the other side of the hybrid lead frame also includes a mirrored version of the one or more retention tabs. Other aspects of the lead frames shown in FIGS. 7B, 7C, and 7D correspond to the aspects of the lead frame 700 discussed in connection with FIG. 7A.

FIG. 7B shows a pair of tabs 734 and 736 having outer edges 754 that are offset or separated from the closest edge of the package body perimeter 720 by an offset distance 756. Each retention tab has a length 724 that is less than the distance between the non-leaded edge of the frame structure 702 and the edge of the package body perimeter 720 (e.g., shorter than length 722 of the tabs shown in FIG. 7A).

It is noted that in both FIGS. 7A and 7B, the top portion of (right) edge 728 has a portion that is farther away from the die pad 708 than the bottom portion of edge 728. Even if the non-leaded edge is not aligned along a single line, the length 722 or 724 of the retention tabs may be measured from the portion of the non-leaded edge between a pair of retention tabs (e.g., from edge 726 between tabs 730 and 732, or from edge 728 between tabs 734 and 736) to outer edge 740 or 754.

As also shown in both FIGS. 7A and 7B, each pair of retention tabs are separated laterally from one another on a respective non-leaded edge by a gap distance 738, which is large enough to accommodate a dam block on the mold tooling, enabling the lead frames shown in FIGS. 7A and 7B to be used in existing mold tooling (e.g., the same mold tooling used to encapsulate lead frames like that shown in FIG. 4). The dam block may fit within the space defined by the gap distance 738 and the distance between the non-leaded edge (e.g., the portion of non-leaded edge between the tabs) and the package body perimeter 720. After the encapsulation process, the dam block is adjacent to the package body formed within perimeter 720.

FIG. 7C shows a single retention tab, such as retention tab 760, extending from each inner edge of the lead frame 700 to an outer edge 740 that is parallel to a closest edge of the package body perimeter 720. The single retention tab 760 falls outside of the package body perimeter 720 (and remains outside of the resulting package body formed within perimeter 720 during encapsulation). In the embodiment shown, the outer edge 740 of the retention tab is immediately adjacent to the package body perimeter 720. In the embodiment shown, the single retention tab 760 is centered on the inner edge of the lead frame, but could be placed in other locations in other embodiments, such as in either location corresponding to tabs 734 or 736 shown in FIG. 7B. In some embodiments, the retention tab 760 has a width 758 and length 722, similar to the retention tabs discussed above in connection with FIG. 7A.

FIG. 7D also shows a single retention tab, such as retention tab 760, extending from each inner edge of the lead frame 700 to an outer edge 754 that is parallel to the closest edge of the package body perimeter 720. In the embodiment shown, the outer edge 754 of the retention tab 760 is separated from the package body perimeter 720 by an offset distance 756. As noted above, the single retention tab 760 could be centered on the inner edge of the lead frame, or placed in other locations such as the locations corresponding to tabs 734 or 736 as shown in FIG. 7B. In some embodiments, the retention tab 760 has a width 758 and length 724, similar to the retention tabs discussed above in connection with FIG. 7B.

It is noted that in both FIGS. 7C and 7D, the non-leaded edge is aligned along a single line, although the non-leaded edge may be differently aligned (e.g., in a manner like FIGS. 7A and 7B. The length 722 or 724 of the retention tabs may be respectively measured from a portion of the non-leaded edge closest to the package body outline 720 to the outer edge 740 or 754. As also shown in both FIGS. 7C and 7D, each retention tab may be centered on the respective non-leaded edge, enabling the lead frames shown in FIGS. 7C and 7D to be used in existing mold tooling (e.g., the same mold tooling used to encapsulate lead frames like that shown in FIG. 1).

The lead frame 700, including the frame structure 702, active lead fingers 704 and 706, die pad 708, connection arms 710, dam bars 712 and 714, and retention tabs 730, 732, 734, and 736 (and 760) discussed above, are formed from an electrically conductive material, examples of which include but are not limited to copper, nickel, or an alloy thereof. Electrical connection contact areas on the lead frame 700 (such as on the inner ends 742 for electrical connections made to a die or on the outer ends 744 for external electrical connections) may also be coated with an electrically conductive material, examples of which include nickel, gold, copper, aluminum, tin, or other suitable conductive metal or alloy composed of one or more suitable conductive metals.

FIG. 8-13, and FIG. 16A-16D illustrate various example non-conductive tie bar structures that may be implemented in a hybrid lead frame. For efficiency's sake, FIG. 8-13 illustrate two embodiments for each non-conductive tie bar structure: one embodiment implemented on a lead frame like that shown in FIG. 7A, and another embodiment implemented on a lead frame like that shown in FIG. 7B. The top retention tab shown in each of FIG. 8-13 has an outer edge 740 that is immediately adjacent to the package body perimeter 720, which corresponds to the retention tabs of the lead frame shown in FIG. 7A. The bottom retention tab shown in each of FIG. 8-13 has an outer edge 754 that is separated from the package body perimeter 720 by offset distance 756, which corresponds to the retention tabs of the lead frame shown in FIG. 7B. In the embodiments shown, both edges 740 and 754 are shown as broken lines to indicate the non-conductive tie bar structure is attached to a top surface of the retention tabs, although the non-conductive tie bar structure may be attached to a bottom surface of the retention tabs in other embodiments (as further discussed below in connection with FIGS. 14 and 15). FIG. 16A-16D show embodiments of non-conductive tie bar structures that may be implemented in a hybrid lead frame like that shown in FIGS. 7C and 7D having single retention tabs on each inner edge of the lead frame. The single retention tab has an outer edge shown as a broken line, which may be either an outer edge 740 that is immediately adjacent to the package body perimeter 720, or has an outer edge 754 that is separated from the package body perimeter 720 by offset distance 756.

It is also noted that, for simplicity's sake, each of FIG. 8-13 and FIG. 16A-16D shows a non-conductive tie bar structure on half of an example hybrid lead frame that may be laterally symmetrical about a central vertical line (e.g., the vertical midline shown in the center of the die pad), where the other side of the hybrid lead frame also includes a mirrored version of the non-conductive tie bar structure.

A non-conductive tie bar structure, like those shown in shown in FIGS. 8-13 and 16A-16D, is made of a non-conductive material, examples of which include but are not limited to one or more of plastic materials, organic polymers, inorganic polymers, polyimides, elastomers, glass fabric, and the like. Portions of such non-conductive tie bar structures are attached or bonded to a pair of retention tabs by a non-conductive adhesive material, examples of which include but are not limited to polymer adhesives, acrylic adhesives, epoxies, pastes, films, thermal interface material (TIM), and the like. Thermal interface material (TIM) is heat conductive, examples of TIM include, but are not limited to, silicone or epoxy-resin based material containing suspended carbon nanotubes, or beryllium oxide, boron nitride, diamond powders, ceramic powders, or other thermally conductive fillers. The non-conductive adhesive materials may be in curable (e.g., by heat or ultraviolet light radiation) or non-cured (e.g., pressure sensitive adhesives) forms. When attached or bonded to the lead frame, the non-conductive tie bar structure has sufficient peel strength to avoid being removed or peeled off of the retention bars during typical lead frame handling (e.g., during encapsulation and trim and form processes), and sufficient shear strength to avoid being torn or sheared from the retention bars during typical lead frame handling.

It is also noted that the non-conductive material and non-conductive adhesive material are able to withstand the high temperatures experienced during the encapsulation process, with minimal changes to the properties of those materials. The non-conductive material and non-conductive adhesive material are also able to provide resistance to any interaction with chemicals that may be used in a plating process applied to the conductive lead frame.

In some embodiments, the non-conductive tie bar structure is formed from thermal tape, which may be a non-conductive material that includes a non-conductive adhesive material, where examples of such materials include those examples provided above. In some embodiments, thermal tape may itself be a layer or film or other structure made of non-conductive adhesive material that provides sufficient peel strength and shear strength.

It is also noted that the non-conductive tie bar structures discussed below each include one or more portions of non-conductive material attached to one or more retention bars of a conductive lead frame, where the one or more portions of non-conductive material may be formed from a single piece of non-conductive material (i.e., a "portion" of the non-conductive material may not necessarily indicate a physically separate piece of non-conductive material, but may instead refer to a part of the whole piece of non-conductive material). Some portions of non-conductive material may have a width equivalent to the width 758 of the retention tabs to which they are attached, or may have a different width in other embodiments.

Figure 10:
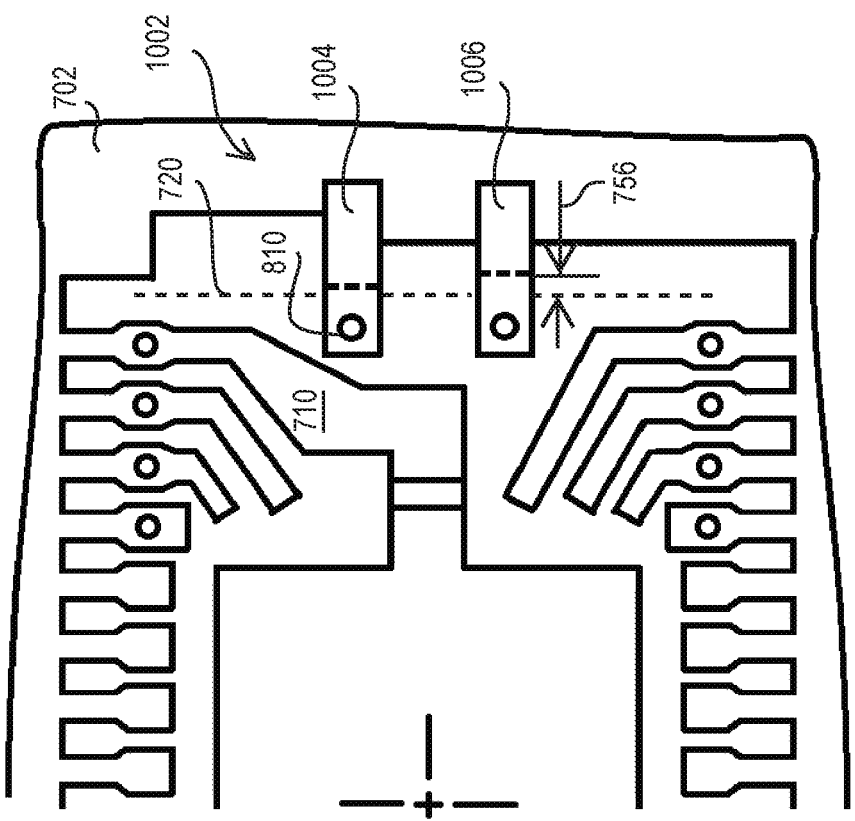

The non-conductive tie bar structure may be formed as a single structure in some embodiments, and may be formed as separate sub-structures in other embodiments (e.g., see FIG. 10). The non-conductive tie bar structure may be formed from one or more pieces of non-conductive material or non-conductive adhesive material, such as one or more strips, squares, boxes, triangles, or other polygonal-shaped pieces. Also, the portion or portions of a non-conductive tie bar structure that extend into the package body perimeter 720 are not limited to rectangular and triangular shapes, and may be any one of a variety of other shapes (e.g., circular, oblong, amorphous, and the like) in other embodiments.

Figure 8:
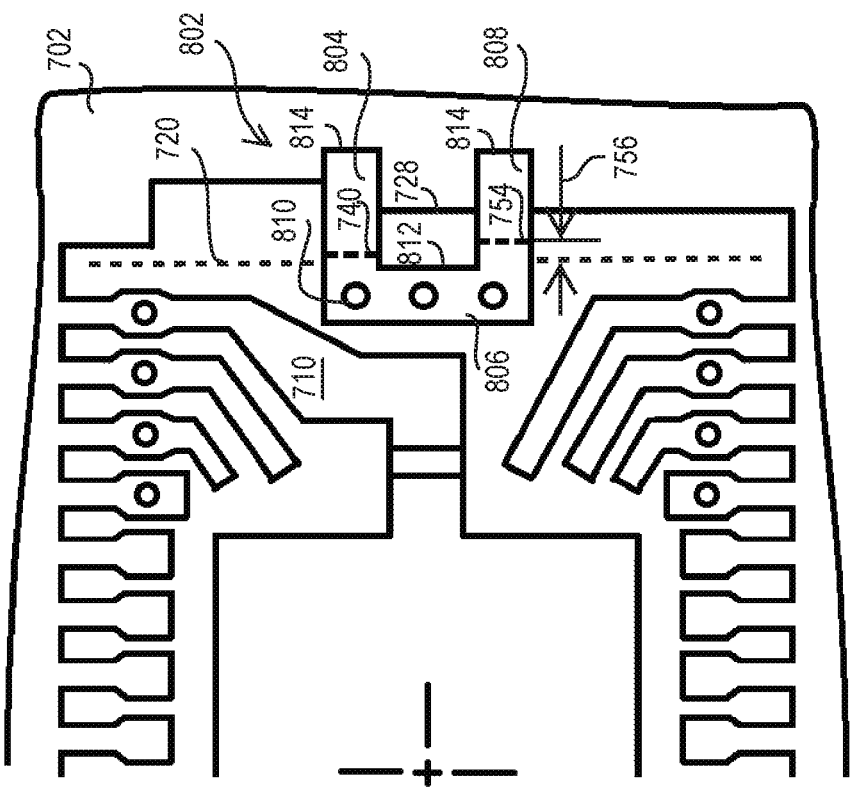

FIG. 8 illustrates a top-down view of an example non-conductive tie bar structure 802 attached to a pair of retention tabs. Structure 802 has one end attached to one of the tabs, shown as portion 804, and has another end that is attached to the other tab, shown as portion 808. As noted above, portions 804 and 808 have a width equivalent to the width 758 of the retention tabs to which they are attached, although such portions may have widths different than width 758 in other embodiments. Portions 804 and 808 each have an edge 814 positioned over the surrounding frame structure 702, where portions 804 and 808 extend past the inner edge 728 of the frame structure 702 and attach to both the retention tabs and to a portion of the surrounding frame structure 702, providing a larger attachment area for the non-conductive tie bar structure rather than only over the retention tabs (although portions 804 and 808 may be attached to only the retention tabs in some embodiments).

Structure 802 also includes an intermediate portion 806 between portions 804 and 808 that extends into the package body perimeter 720. In the embodiment shown, portion 806 remains in a space adjacent to the die pad connection arm 710 within the package body perimeter 720, without contacting any neighboring lead fingers (e.g., to avoid reducing the electrical connection contact area on the lead fingers). Other embodiments of non-conductive tie bar structures that contact the die pad connection arm 710 are discussed below in connection with FIGS. 12 and 13. The portion of structure 802 that falls within the package body perimeter 720 becomes embedded within the package body during encapsulation. In the embodiment shown, the intermediate portion 806 has an inner edge 812 that is aligned with package body perimeter 720, which allows structure 802 to remain outside of an area in which a dam block may be present (e.g., a dam block in the space defined between perimeter 720 and edge 728 and between the inner edges of the pair of retention tabs). However, inner edge 812 may fall completely within the package body perimeter 720 in other embodiments, as discussed below.

Portion 806 may also include one or more holes 810 as a locking feature (also referred to as locking holes 810). During encapsulation and trim and form processes, the hybrid lead frame is exposed to vibration and other movement that may cause the structure 802 to be pulled out of the package body, which may result in the hybrid lead frame falling off of the mold tooling or the package body becoming misaligned or damaged. By including locking holes 810 that fall within the package body perimeter 720, the cured encapsulation material is present within the locking holes 810 to prevent portion 806 from being pulled out of the package body due to vibration and other movement. Another locking feature may be implemented by having the inner edge 812 of the intermediate portion 806 fall within the package body perimeter 720 to allow the cured encapsulation material to fully surround the intermediate portion 806.

Figure 9:
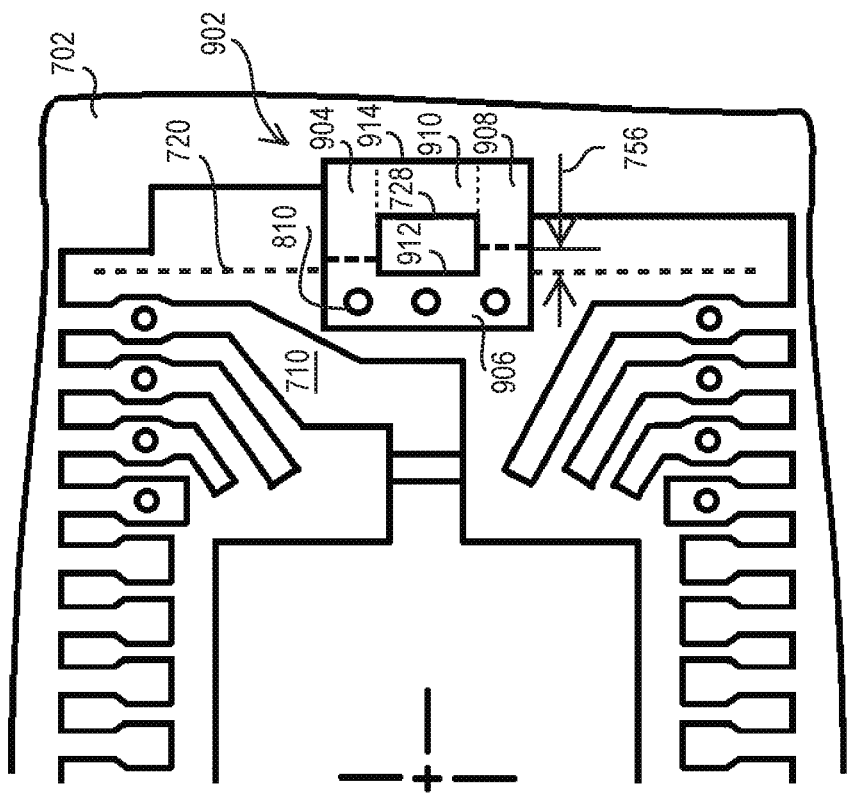
FIG. 8, FIG. 9, FIG. 10, FIG. 11, FIG. 12, FIG. 13, FIG. 16A, FIG. 16B, FIG. 16C, and FIG. 16D illustrate block diagrams depicting top-down views of example non-conductive tie bar structures of a hybrid lead frame in which the present disclosure is implemented, according to some embodiments.

FIG. 9 illustrates a top-down view of an example non-conductive tie bar structure 902 attached to a pair of retention tabs. Structure 902 is similar to structure 802, with an additional portion that extends over a portion of the surrounding frame structure for a larger attachment area and increased peel strength of the structure 902. Structure 902 includes portion 904 and 908 that are attached to the retention tabs. Structure 902 includes an intermediate portion 906 between portions 904 and 908 that extends into package body perimeter 720 and includes one or more locking holes 810. Structure 902 does not contact the die pad connection arm 710 or neighboring lead fingers. Structure 902 also includes portion 910 that is attached to a surface of the lead frame (e.g., to a surface of frame structure 702) between portions 904 and 908. Portion 910 has one edge aligned with the inner edge 728 of the lead frame, and another edge 914 that is positioned over the frame structure 702. Portions 904 and 908 also have edges aligned with edge 914, where portions 904, 908, and 910 extend past inner edge 728 and attach to both the retention tabs and to a portion of the frame structure 702. The non-conductive tie bar structures shown in FIGS. 10-13 and 16A-16D either have a pair of edges similar to edges 814 (as shown in FIG. 8) or a single edge 914 (as shown in FIG. 9) positioned over the frame structure 702.

In the embodiment shown, structure 902 has an inner edge 912 that is aligned with package body perimeter 720, although edge 912 may fall within perimeter 720 as a locking feature in other embodiments. Structure 902 remains outside of the area in which a dam block may be present (e.g., in the space between perimeter 720 and edge 728 and between the inner edges of the pair of retention tabs). Put another way, structure 902 shown in FIG. 9 includes a window or opening within which a dam block may be present. In other embodiments, structure 902 may be formed without the window or opening (e.g., structure 902 is a rectangular piece of non-conductive material), where the dam block of the mold tooling may clamp down on the structure 902 in the area between perimeter 702 and edge 728 between the inner edges of the pair of retention tabs, which is further discussed below in connection with FIG. 17A-17D.

FIG. 10 illustrates a top-down view of an example non-conductive tie bar structure 1002 attached to a pair of retention tabs. Structure 1002 includes portions 1004 and 1006 that are attached to the pair of retention tabs. Portions 1004 and 1006 may also be referred to as sub-structures 1004 and 1006 of structure 1002. Each sub-structure 1004 and 1006 extends into package body perimeter 720 and includes one or more locking holes 810. Sub-structures 1004 and 1006 do not contact the die pad connection arm 710 or neighboring lead fingers. In other embodiments, structure 1002 may include an additional portion attached to a surface of the lead frame between sub-structures 1004 and 1006 (e.g., in a manner like portion 910 shown in FIG. 9). Structure 1002 remains outside of the area in which a dam block may be present (e.g., in the space defined between perimeter 720 and edge 728 and between the inner edges of the pair of retention tabs).

Figure 11:
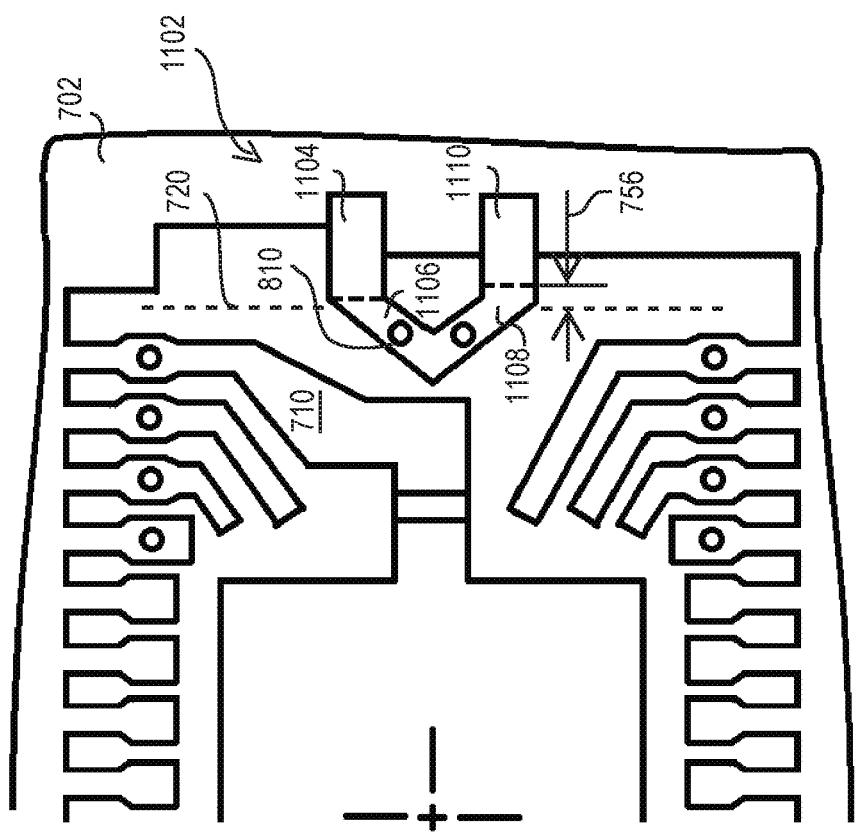

FIG. 11 illustrates a top-down view of an example non-conductive tie bar structure 1102 attached to a pair of retention tabs. Structure 1102 includes portions 1104 and 1110 that are attached to the pair of retention tabs. Structure 1102 also includes intermediate portions 1106 and 1108 between portions 1104 and 1110 that extend into package body perimeter 720, which include one or more locking holes 810. Structure 1102 does not contact the die pad connection arm 710 or neighboring lead fingers. Structure 1102 remains outside of the area in which a dam block may be present (e.g., in the space defined between perimeter 720 and edge 728 and between the inner edges of the pair of retention tabs).

In other embodiments, structure 1102 may include an additional portion attached to a surface of the lead frame between portions 1104 and 1110 (e.g., in a manner like portion 910 shown in FIG. 9) to form a window or opening within which a dam block may be present. In still other embodiments, structure 1102 may be formed without the window or opening (e.g., formed as a single piece of non-conductive material), where the dam block of the mold tooling may clamp down on the structure 1102 between perimeter 720 and edge 728 between the inner edges of the pair of retention tabs.

Figure 12:
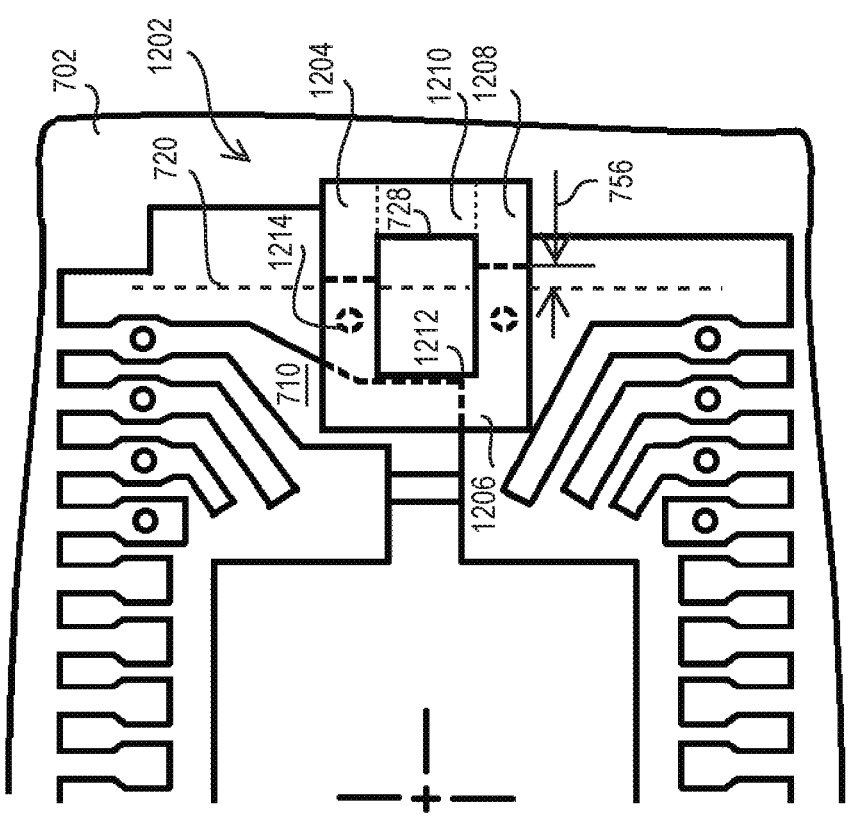

FIG. 12 illustrates a top-down view of an example non-conductive tie bar structure 1202 attached to a pair of retention tabs. Structure 1202 includes portions 1204 and 1208 that are attached to the pair of retention tabs. Structure 1202 also includes portion 1210 that is attached to a surface of the lead frame (e.g., to a surface of frame structure 702) between portions 1204 and 1208. Portion 1210 has an inner edge aligned with the inner edge 728 of the lead frame. Structure 1202 also includes intermediate portion 1206 between portions 1204 and 1208 that extends into package body perimeter 720. In the embodiment shown, portion 1206 is attached to a surface of the die pad connection arm 710, without contacting any neighboring lead fingers (e.g., to avoid reducing the electrical connection contact area on the lead fingers). In the embodiment shown, portion 1206 has an inner edge 1212 that is aligned with an edge of the die pad connection arm 710, which allows cured encapsulation material to fully surround the intermediate portion 1206 and provides a locking feature that prevents the structure 1202 from being pulled out of the package body. In other embodiments, inner edge 1212 may not align with the die pad connection arm 710. Structure 1202 also optionally includes one or more locking holes 1214, which are illustrated as circles with broken lines.

Structure 1202 remains outside of an area in which a dam block may be present, (e.g., in the space defined between perimeter 720 and edge 728 and between the inner edges of the pair of retention tabs). Put another way, structure 1202 includes a window or opening within which a dam block may be present, where the window also extends into the package body perimeter 720.

Figure 13:
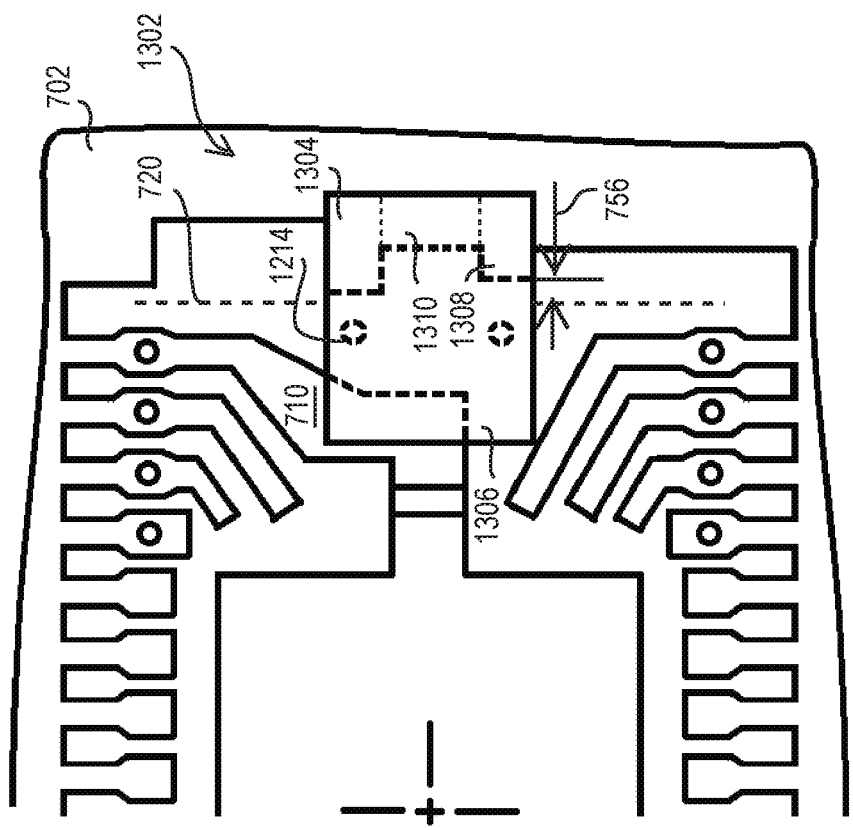

FIG. 13 illustrates a top-down view of an example non-conductive tie bar structure 1302 attached to a pair of retention tabs. Structure 1302 is similar to structure 1202, but formed without a window. Structure 1302 includes portions 1304 and 1308 that are attached to the pair of retention tabs. Structure 1302 also includes portion 1310 that is attached to a surface of the lead frame (e.g., to a surface of frame structure 702) between portions 1304 and 1308. Structure 1302 also includes portion 1306, which is adjacent to portions 1304, 1308, and 1310, and extends into package body perimeter 720. Portion 1306 is attached to a surface of the die pad connection arm 710, without contacting any neighboring lead fingers (e.g., to avoid reducing the electrical connection contact area on the lead fingers). Structure 1302 also optionally includes one or more locking holes 1214, which are illustrated as circles with broken lines.

In the embodiment shown, structure 1302 is a rectangular piece (or other polygonal, round, circular, oval, or amorphous shaped piece) of non-conductive material, where the dam block of the mold tooling may clamp down on the structure 1302 in the area between perimeter 720 and edge 728 between the inner edges of the pair of retention tabs, as further discussed below in connection with FIG. 17A-17D.

Figure 16A:
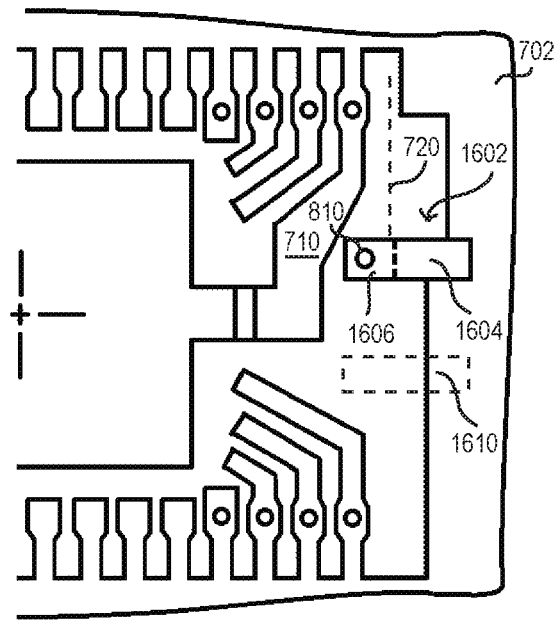

FIG. 16A illustrates a top-down view of an example non-conductive tie bar structure 1602 attached to a single retention tab. Structure 1602 includes portion 1604 that is attached to the single retention tab, and portion 1606 that extends into package body perimeter 720 and includes one or more locking holes 810. Portion 1606 does not contact the die pad connection arm 710 or neighboring lead fingers. In some embodiments, portion 1604 extends over and is attached to a surface of the surrounding lead frame (e.g., over a portion of frame structure 702). Structure 1602 remains outside of the area in which a dam block may be present, as discussed above. For example, structure 1602 may be alternately located at location 1610, similar to the location of tab 736 shown in FIGS. 7A and 7B.

Figure 16B:
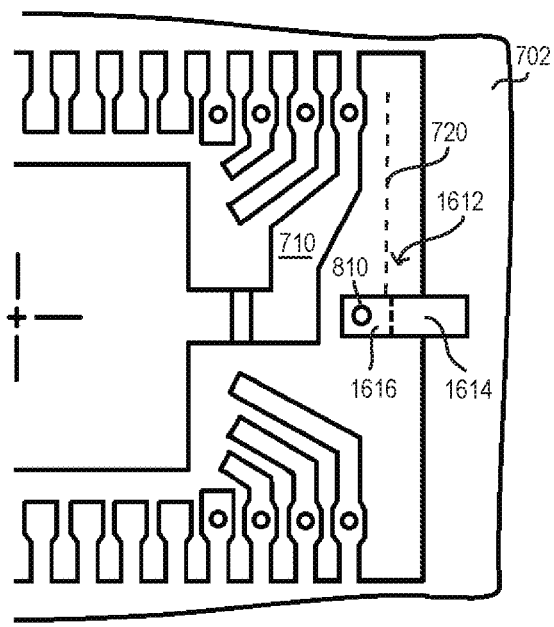

FIG. 16B illustrates a top-down view of another example non-conductive tie bar structure 1612 attached to a single retention tab in a centered location on the inner edge of the lead frame. Structure 1612 includes portion 1614 that is attached to the single retention tab, and portion 1616 that extends into package body perimeter 720 and includes one or more locking holes 810, without contacting the die pad connection arm 710 or neighboring lead fingers. Portion 1614 may also extend over and attach to a surface of the surrounding lead frame.

Figure 16C:
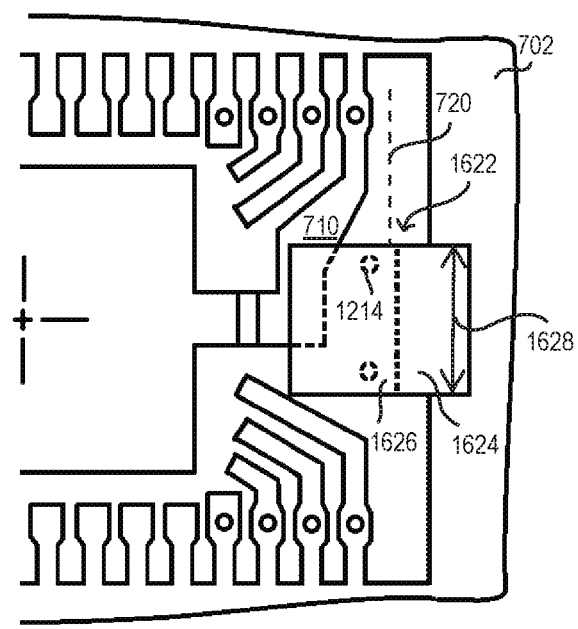

FIG. 16C illustrates a top-down view of an example non-conductive tie bar structure 1622 attached to a single retention tab centered on the inner edge of the lead frame. In the embodiment shown, the single retention tab has a larger width 1628 than the widths shown in previous figures. Structure 1622 includes portion 1624 that is attached to the single retention tab, and portion 1626 that extends into package body perimeter 720 and is attached to a surface of the die pad connection arm 710, without contacting any neighboring lead fingers. Structure 1622 also optionally includes one or more locking holes 1214, which are illustrated as circles with broken lines.

Figure 16D:
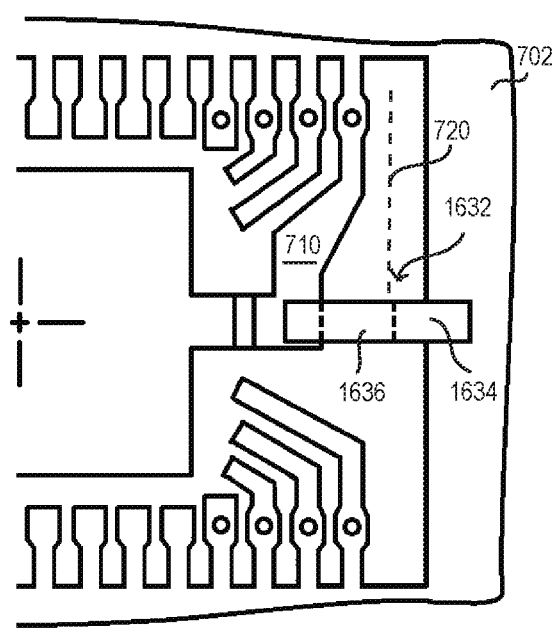

FIG. 16D illustrates a top-down view of an example non-conductive tie bar structure 1632 attached to a single retention tab centered on the inner edge of the lead frame. Structure 1632 includes portion 1634 that is attached to the single retention tab, and portion 1636 that extends into the package body perimeter 720 and is attached to a surface of the die pad connection arm 710, without contacting any neighboring lead fingers. Structure 1632 may also optionally include one or more locking holes 1214.

Figure 14:
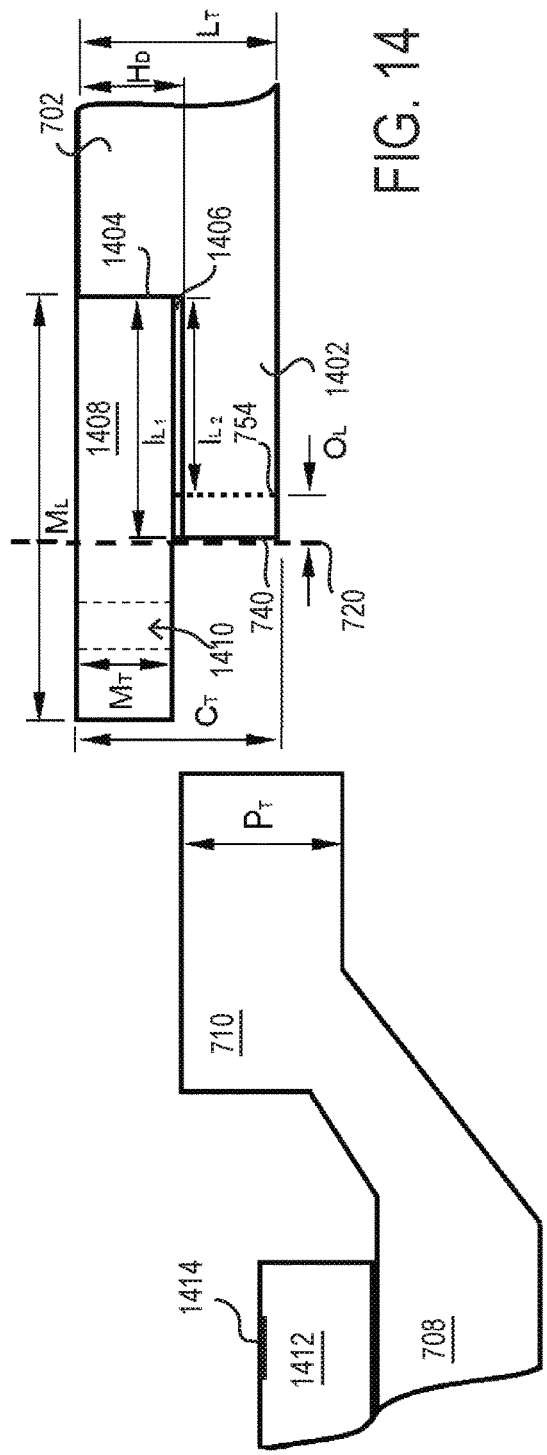
FIG. 14, FIG. 15, FIG. 17A, FIG. 17B, FIG. 17C, and FIG. 17D illustrate block diagrams depicting cross-sectional views of example non-conductive tie bar structures of the hybrid lead frame, according to some embodiments.

FIG. 14 shows a cross-sectional view of an example non-conductive tie bar structure attached to a retention tab. Retention tab 1402 extends from a surrounding frame structure 702 having a lead frame thickness LT, which may be in the range of 100 microns to 500 microns. In the embodiment shown, a portion of the lead frame including the retention tab 1402 is half-etched or coined to a depth HD measured from a top surface of the frame structure 702. A side wall 1404 of the frame structure 702 that results from the half-etching is also shown. A non-conductive tie bar structure is attached to the half-etched (top) surface of the retention tab 1402. It is noted that "half-etch" or "half-etched depth" as used herein indicates that the thickness of the retention tab is less than the thickness of the surrounding frame structure 702. The depth HD need not be limited to half of the lead frame thickness LT, and may be greater or less than LT/2.

In the embodiment shown, the non-conductive tie bar structure includes non-conductive material 1408 that has a material thickness MT and a material length ML, and non-conductive adhesive material 1406 that also has some thickness to bond or attach a surface of the non-conductive material 1408 to the half-etched surface of retention tab 1402. In other embodiments, the non-conductive tie bar structure may itself be made of a non-conductive adhesive material having a material thickness MT and material length ML that bonds or attaches to the half-etched surface of retention tab 1402, and may also bond or attach to the side wall 1404. In both embodiments, the non-conductive tie bar structure includes sufficient material and adhesive strength to minimize peeling or shearing of the non-conductive tie bar structure from the retention tab 1402 during typical lead frame handling. Non-conductive material 1408 also includes one or more locking holes 1410.

In the embodiment shown, the retention tab 1402 is half-etched to a depth HD measured from a top surface of the lead frame, where the non-conductive tie bar structure is attached to a top (half-etched) surface of the retention tab 1402. The half-etched depth HD is equivalent to the combined thicknesses of the non-conductive material 1408 and the non-conductive adhesive material 1406, which allows the top surface of the non-conductive material 1408 to be coplanar with a top surface of the lead frame. Put another way, the total combined thickness CT of the non-conductive material 1408, the non-conductive adhesive material 1406, and the remaining thickness of the retention tab 1402 is equal to the full lead frame thickness LT. In embodiments where the non-conductive tie bar structure is made of a non-conductive adhesive material, the half-etched depth HD is equivalent to the material thickness MT of such non-conductive adhesive material.

In other embodiments, the retention tab 1402 may be half-etched from a bottom surface of the lead frame, where the non-conductive tie bar structure is attached to a bottom (half-etched) surface of the retention tab 1402 (e.g., the representation of the retention tab 1402 is turned "upside-down" in FIG. 14). The half-etched depth HD that is equivalent to the combined thicknesses of materials 1408 and 1406 would also allow the bottom surface of the non-conductive material 1408 to be coplanar with a bottom surface of the lead frame.

Two embodiments of retention tab 1402 are shown in FIG. 14 (and in FIG. 15): one embodiment having an outer edge 740 shown as a solid line, which is immediately adjacent to the package body perimeter 720 (e.g., like that shown in FIG. 7A), and another embodiment having an outer edge 754 shown as a broken line, which is offset from package body perimeter 720 by an offset length OL (e.g., like that shown in FIG. 7B). The offset length OL may fall within a range of 50 to 100 microns. The non-conductive adhesive material 1406 is present along the half-etched surface of the retention tab 1402 from the outer edge of the retention tab 1402 up to the side wall 1404, which is also referred to as an attachment area for the non-conductive tie bar structure. The non-conductive adhesive material 1406 has an interface length ID in embodiments of retention tab 1402 having outer edge 740, and has a shorter interface length IL2 in embodiments of retention tab 1402 having outer edge 754. The attachment area is defined by the width 758 of the retention tabs and the respective interface length ID or IL2. Interface lengths ID or IL2 can be increased to ensure that the attachment area is large enough for sufficient adhesion of the non-conductive tie bar structure to the lead frame.

In some embodiments, a portion of the surrounding frame structure 702 beyond the retention tabs is also half-etched to provide a larger attachment area for the non-conductive tie bar structure. In other words, the side wall 1404 is equivalent to edge 814 (shown in FIG. 8) or edge 914 (shown in FIG. 9). In other words, the interface length ID and length IL2 are respectively longer than the retention tab length 722 (shown in FIG. 7A) and length 724 (shown in FIG. 7B). A further portion of the surrounding frame structure 702 along edge 728 between the retention tabs may also be half-etched for embodiments like those shown FIGS. 9, 12, and 13 (e.g., the frame structure 702 is further half-etched under portion 910 in FIG. 9, portion 1210 in FIG. 12, and portion 1310 in FIG. 13).

A die pad connection arm 710 is also shown in FIG. 14 (and FIG. 15), which is connected to die pad 708. A back side of a semiconductor die 1412 is attached to a top surface of the die pad 708 using a die attach material that has sufficient adhesive strength to withstand the ultrasonic or thermosonic forces present during wire bonding or a similar electrical interconnection formation process. A front side or active side of the semiconductor die 1412 is facing and includes a number of contact or bond pads 1414 that provide connections to internal active circuitry of the semiconductor die 1412. The pads 1414 are electrically connected with the inner ends of the lead fingers of the lead frame (e.g., in shown in FIGS. 7A and 7B). The die pad connection arm 710 has a thickness PT, which may be equivalent to the (full) lead frame thickness LT. It is noted that the die pad connection arm 710 is shown at a lower elevation relative to the frame structure 702 in FIGS. 14 and 15, depending on how the lead frame is pressed or stamped.

The semiconductor die 1412 may have a size ranging from 1.5 mm×1.5 mm to 12 mm×12 mm, and may have a thickness ranging from 150 to 550 microns. The pads 1414 are formed from an electrically conductive material, examples of which include but are not limited to nickel, gold, copper, aluminum, or other suitable conductive metal or alloy composed of one or more suitable conductive metals. Examples of die attach material include but are not limited to polymer adhesives, epoxies, solders, pastes, films, tailored die cut tapes, and the like. Thermal interface material (TIM) may also be used as the die attach material, which is heat conductive, allowing die pad 708 to act as a heat sink for die 1412, in some embodiments.

The semiconductor die 1412 may be singulated from a semiconductor wafer, which can be any semiconductor material or combinations of materials, such as gallium arsenide, silicon germanium, silicon-on-insulator (SOI), silicon, monocrystalline silicon, the like, and combinations of the above. The active circuitry of the semiconductor die 1412 may include integrated circuit components that are active when the die 1412 is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, oscillator, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

In other embodiments, an electronic component 1412 is attached to a support structure such as a flag 708 of the lead frame 700. Examples of an electronic component 1412 include but are not limited to a passive device, such as a relay, a resistor, an inductor, a capacitor, a diode, a power transistor, a oscillator, and the like, another type of electronic device, and a semiconductor device, such as a semiconductor die, described above. Such an embodiment may still be processed in the same manner as described below (e.g., attachment to the lead frame, encapsulated, trim and form, singulation), resulting in a packaged electronic device.

Figure 15:
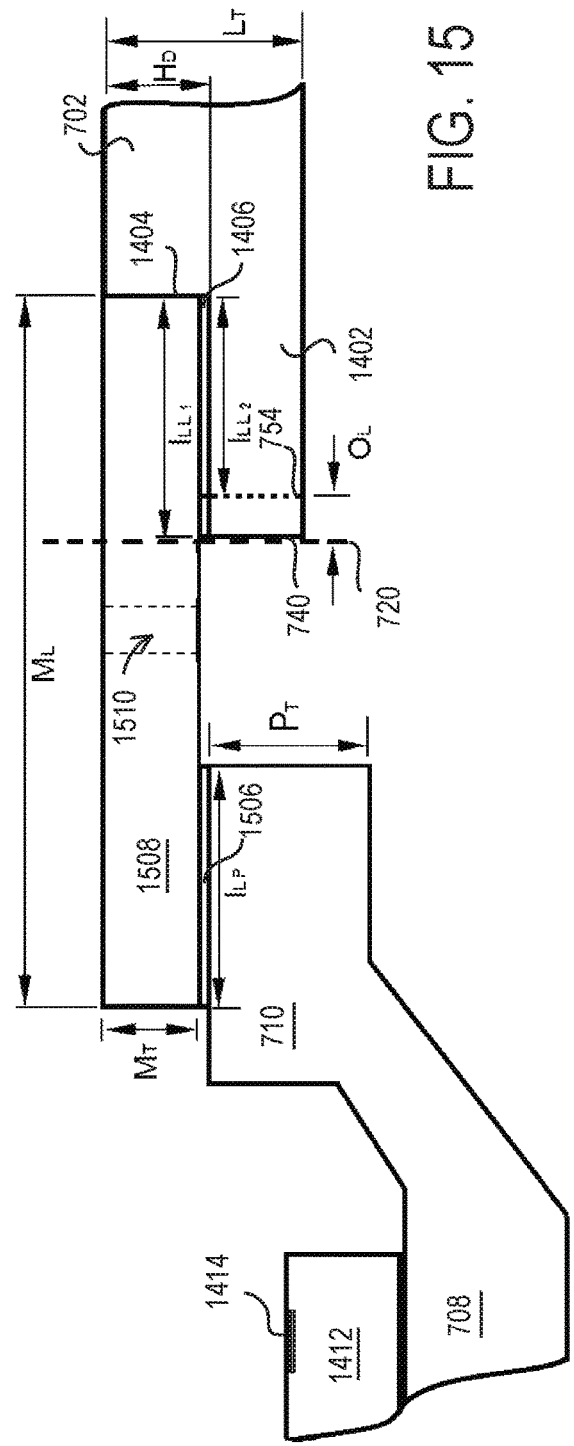

FIG. 15 shows a cross-sectional view of another example non-conductive tie bar structure, which is attached to a retention tab 1402 and a die pad connection arm 710. In the embodiment shown, the non-conductive tie bar structure includes non-conductive material 1508 that has a material thickness MT and a material length ML measured from side wall 1404 to an opposite end positioned over die pad connection arm 710. The non-conductive tie bar structure also includes non-conductive adhesive material 1406 that has some thickness, which bonds or attaches the non-conductive material 1508 to a half-edge surface of retention tab 1402, as discussed above. The non-conductive tie bar structure also includes non-conductive adhesive material 1506 having some thickness, which bonds or attaches the non-conductive material 1508 to a top surface of the die pad connection arm 710 within another attachment area having an interface length ILP. The attachment area should be large enough (e.g., by increasing interface length ILP) for sufficient adhesion of the non-conductive tie bar structure to the die pad connection arm 710.

In other embodiments, the non-conductive tie bar structure may itself be made of a non-conductive adhesive material having a material thickness MT and material length ML that bonds or attaches to the half-etched surface of retention tab 1402 and the top surface of the die pad connection arm 710, and may further bond or attach to the side wall 1404. In both embodiments, the non-conductive tie bar structure includes sufficient material and adhesive strength to minimize peeling or shearing of the non-conductive tie bar structure from the retention tab 1402 and from the die pad connection arm 710 during typical lead frame handling. Non-conductive material 1508 also optionally includes one or more locking holes 1510. Other aspects of the lead frame shown in FIG. 15 correspond to those aspects of the lead frame discussed in connection with FIG. 14. By being attached to both the die pad connection arm 710 and the retention tab 1402, additional rigidity is provided to non-conductive material 1508.

As shown in FIG. 17A-17D, a semiconductor die 1412 is attached to the die pad 708 of the hybrid lead frame, which is then placed within a mold cavity 1708 of mold tooling to form the package body during the encapsulation process. The mold tooling may include a top mold clamp 1702 and a bottom mold clamp 1704. FIG. 17A-17D each shows a portion of the mold tooling near one edge of the hybrid lead frame. In some embodiments, the mold tooling also includes a dam block 1706, such as on the bottom mold clamp 1704, that fits within the space between the retention tabs outside of the package body perimeter. Mold clamps 1702 and 1704 close down on the hybrid lead frame in the vicinity near the frame structure 702 and retention tabs 1402.

Figure 17A:
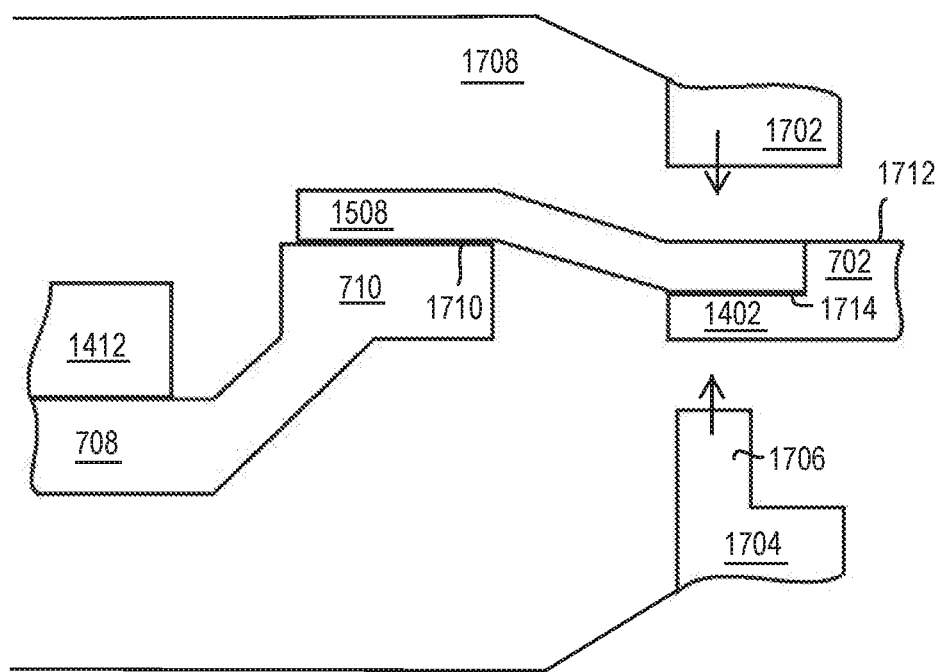
Figure 17B:
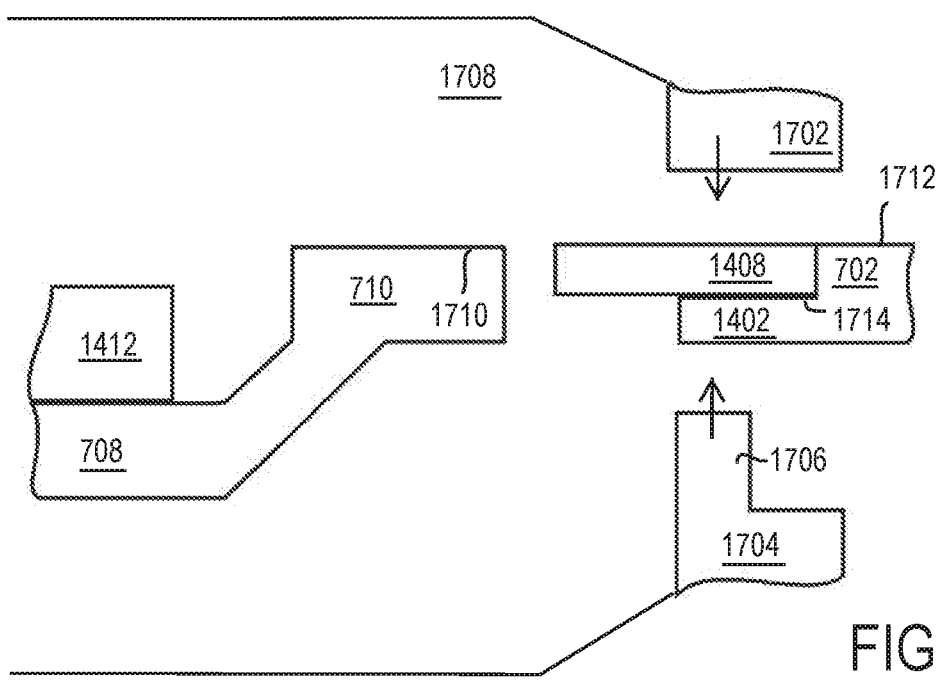

FIG. 17A shows a cross-section view of a non-conductive tie bar structure that includes non-conductive material 1508 attached to both a retention tab 1402 and a die pad connection arm 710. In the embodiment shown, the top surface 1710 of the die pad connection arm 710 and the top surface 1712 of the surrounding frame structure 702 are coplanar. Since the non-conductive material 1508 of the non-conductive tie bar structure is attached to both the top surface 1710 of the die pad connection arm 710 and the half-etched surface 1714 of the retention tab 1402, non-conductive material 1508 is somewhat deformed. However, in other embodiments like that shown in FIG. 17B where the non-conductive material 1408 is attached to the retention tab 1402 without being attached to the die pad connection arm 710, the non-conductive material 1408 is not deformed when the top surfaces 1710 and 1712 are coplanar. In both FIGS. 17A and 17B, since the non-conductive material 1508 or 1408 is attached to the half-etched surface of retention tab 1402, the top surface of the non-conductive material 1508 and 1408 remains coplanar with the top surface 1712 of the frame structure 702, providing a uniform or planar surface on which mold clamp 1702 can close, which avoids pinching, cutting, or otherwise damaging the non-conductive material 1508 or 1408.

Figure 17C:
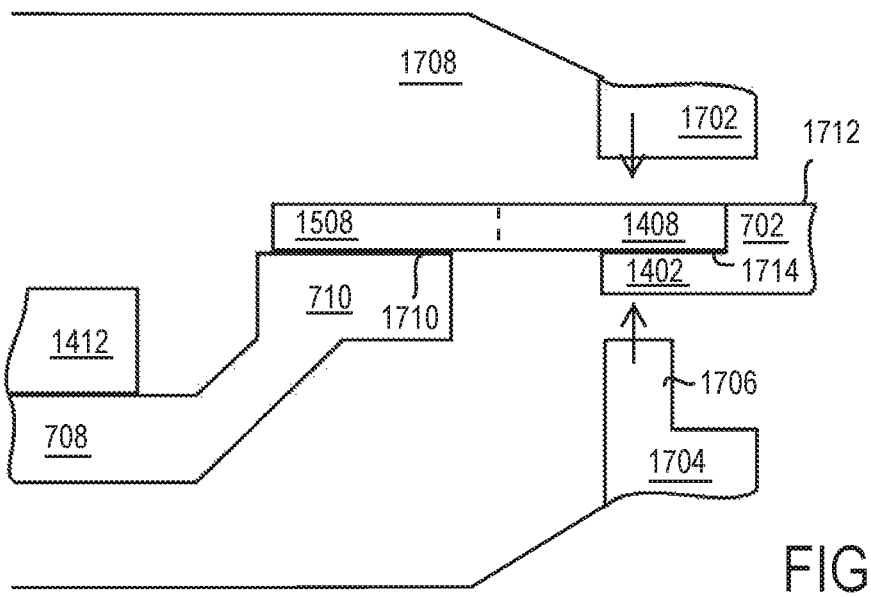

In other embodiments like that shown in FIG. 17C, the die pad connection arm 710 is formed (e.g., pressed or stamped)

such that the top surface 1710 of the die pad connection arm 710 becomes coplanar with the half-etched surface 1714 of the retention tab 1402. For efficiency's sake, FIG. 17C shows two embodiments: non-conductive material 1508 that is attached to both surfaces 1710 and 1714, and non-conductive material 1408 that is attached to surface 1714 and has an end shown by a dotted line. Since the surfaces 1710 and 1714 are coplanar, non-conductive material 1508 achieves planarity without sagging or deformation. Similarly, the top surface of the non-conductive material 1508 and 1408 remains coplanar with the top surface 1712 of the frame structure 702, providing a planar surface on which mold clamp 1702 can close.

Figure 17D:
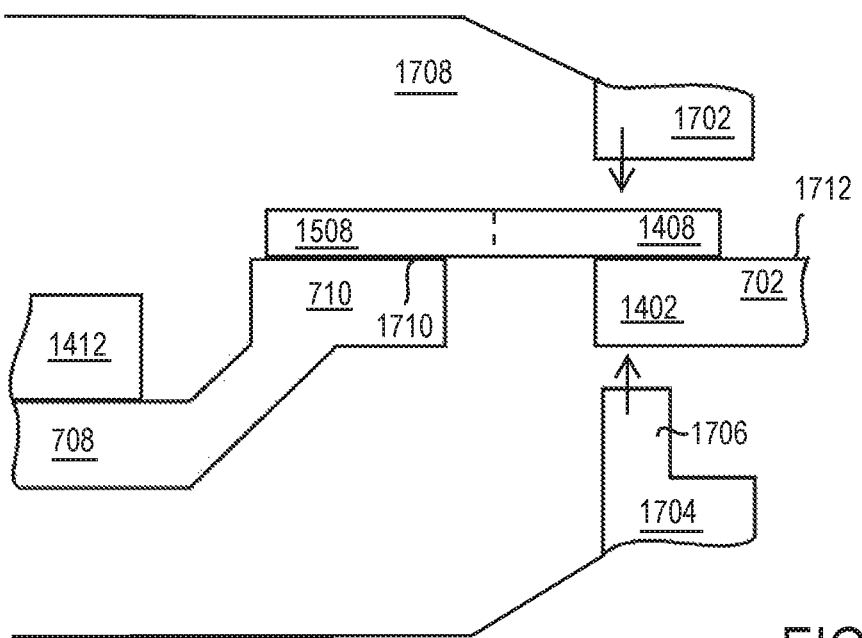

In still other embodiments like that shown in FIG. 17D, the retention tab 1402 is not half-etched, where the top surfaces 1710 and 1712 are coplanar. For efficiency's sake, FIG. 17D also shows two embodiments: non-conductive material 1508 that is attached to both surfaces 1710 and 1712, and non-conductive material 1408 that is attached to surface e1712 and has an end shown by a dotted line. Since the surfaces 1710 and 1712 are coplanar, non-conductive material 1508 achieves planarity without sagging or deformation. The non-conductive material 1508 and 1408 in such an embodiment requires enough material strength to withstand any deformation caused by the closed mold clamp 1702, in order to avoid pinching, cutting, or otherwise damaging the non-conductive material 1508 and 1408. In yet another embodiment similar to that shown in FIG. 17D, the retention tab 1402 is not half-etched and the top surfaces 1710 and 1712 are not coplanar (e.g., surface 1710 is higher or lower than surface 1712). In such an embodiment, the non-conductive material 1508 and 1408 still has enough material strength to withstand any deformation caused by the closed mold clamp 1702, in order to avoid pinching, cutting, or otherwise damaging the non-conductive material 1508 and 1408.

Figure 18:
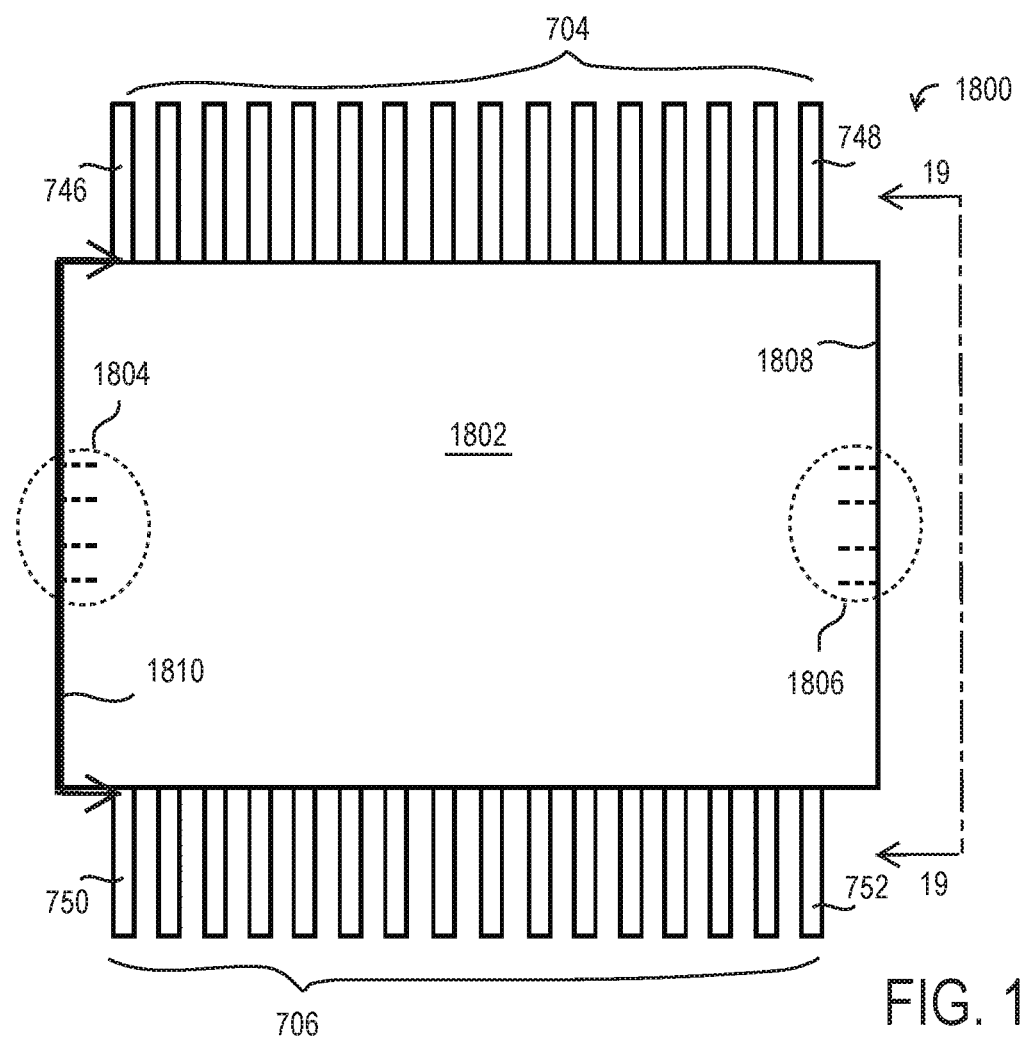
FIG. 18, FIG. 19A, FIG. 19B, FIG. 20, and FIG. 21 illustrate block diagrams depicting various views of a semiconductor die package built on the hybrid lead frame, according to some embodiments.

FIG. 18 shows a top-down view of a resulting semiconductor die package 1800 after the encapsulation process forms a package body 1802 on a hybrid lead frame that includes non-conductive tie bar structures like any of those shown in FIG. 8-13 or 16D on a conductive lead frame like that shown in FIG. 7A or 7B or similar lead frame, and after a subsequent trim and form process is performed. During the encapsulation process, the hybrid lead frame is placed within a mold cavity of mold tooling. Liquid encapsulant material is injected into the mold cavity and cured to form the package body 1802. Examples of encapsulant material include but are not limited to a mold compound based on a biphenyl type or multi-aromatic type epoxy resin, but may be other types of encapsulant material in other embodiments.

The trim and form process leaves two sets of leads 704 and 706 that extend outward from opposing sides (or leaded sides) of the package body 1802. The package body 1802 has an outer lateral edge or surface, indicated as package body outline 1808, which corresponds to the package body perimeter 720, discussed above. The package 1800 is then singulated from the surrounding lead frame (or from the frame structure 702) by cutting the non-conductive tie bar structure adjacent to the package body outline 1808. In embodiments of the hybrid lead frame where the retention tab is immediately adjacent to the package body outline 1808, cutting the non-conductive tie bar structure may include cutting both the non-conductive material and the retention tab to separate the package 1800 from the surrounding lead frame. In embodiments of the hybrid lead frame where the retention tab is separated from the package body outline 1808 by the offset distance 756, cutting the non-conductive tie bar structure may include cutting the non-conductive material without cutting the retention tab (e.g., the offset distance 756 is greater than a width of the saw blade or other cutting tool used to separate the package 1800 from the surrounding lead frame).

Portions of the non-conductive tie bar structures 1804 and 1806 that remain within the package body 1802 after singulation are shown in dotted lines, where the non-conductive tie bar structures may each include one or more sub-structures. The remnants of the non-conductive tie bar structures 1804 and 1806 each have an end surface exposed at the surface of the package body 1802 on the non-leaded sides of the package body 1802, where the end surfaces of the remnants 1804 and 1806 are substantially coplanar with the surface of the package body 1802. The dotted lines of the example non-conductive tie bar structure 1804 and 1806 represent both an embodiment having two strips or pieces (e.g., sub-structures) extending through the package body 1802 like the structures shown in FIG. 8-12, and an embodiment having a single strip or piece (e.g., the outermost dotted lines) extending through the package body 1802 like the structure shown in FIG. 13 or FIG. 16D, although any of the embodiments of the non-conductive tie bar structures discussed above may be implemented in semiconductor die package 1800. The package 1800 may be singulated from a lead frame array, where a plurality of packages has been formed on each lead frame unit and singulated from the lead frame array, as discussed above.

Figure 19A:
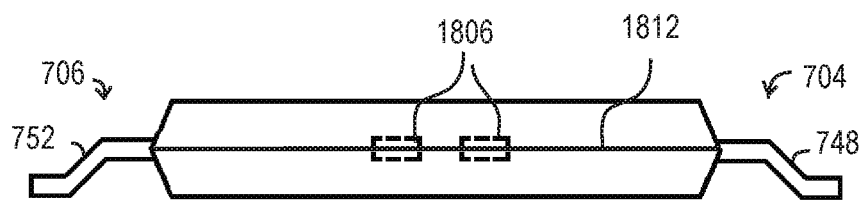
Figure 19B:
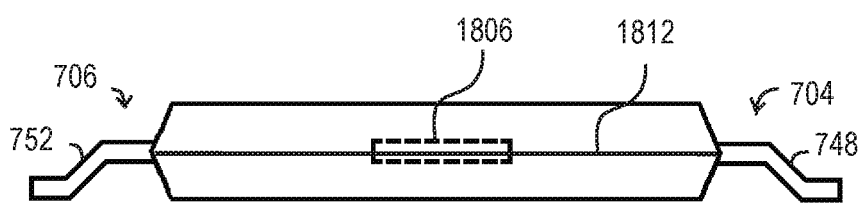

Since the remnants of the tie bar structures 1804 and 1806 that remain at the surface of the package body 1802 are non-conductive, the outermost leads of the sets of leads 704 and 706 are successfully separated by a minimum creepage distance equivalent to the distance measured between the outermost leads. As shown in FIG. 18, creepage distance 1810 is measured between the outermost leads 746 and 750 along package body outline 1808 (or the surface of package body 1802). FIG. 19A shows a head-on end view of the resulting semiconductor die package 1800 with an embodiment of two strips of non-conductive material at the package body outline (or surface) 1808, similarly showing creepage distance 1812 measured between the outermost leads 748 and 752. FIG. 19B shows a head-on view of the resulting semiconductor die package 1800 with an embodiment of a single piece of non-conductive material (which may include a single retention tab or two or more retention tabs) at the package body outline (or surface) 1808, similarly showing creepage distance 1812 between leads 748 and 752. In other words, when the outermost leads 746 and 750 (or leads 748 and 752) are physically separated by at least 8.0 mm of solid insulation material, that distance achieves adequate high voltage isolation between the outermost leads.

Figure 20:
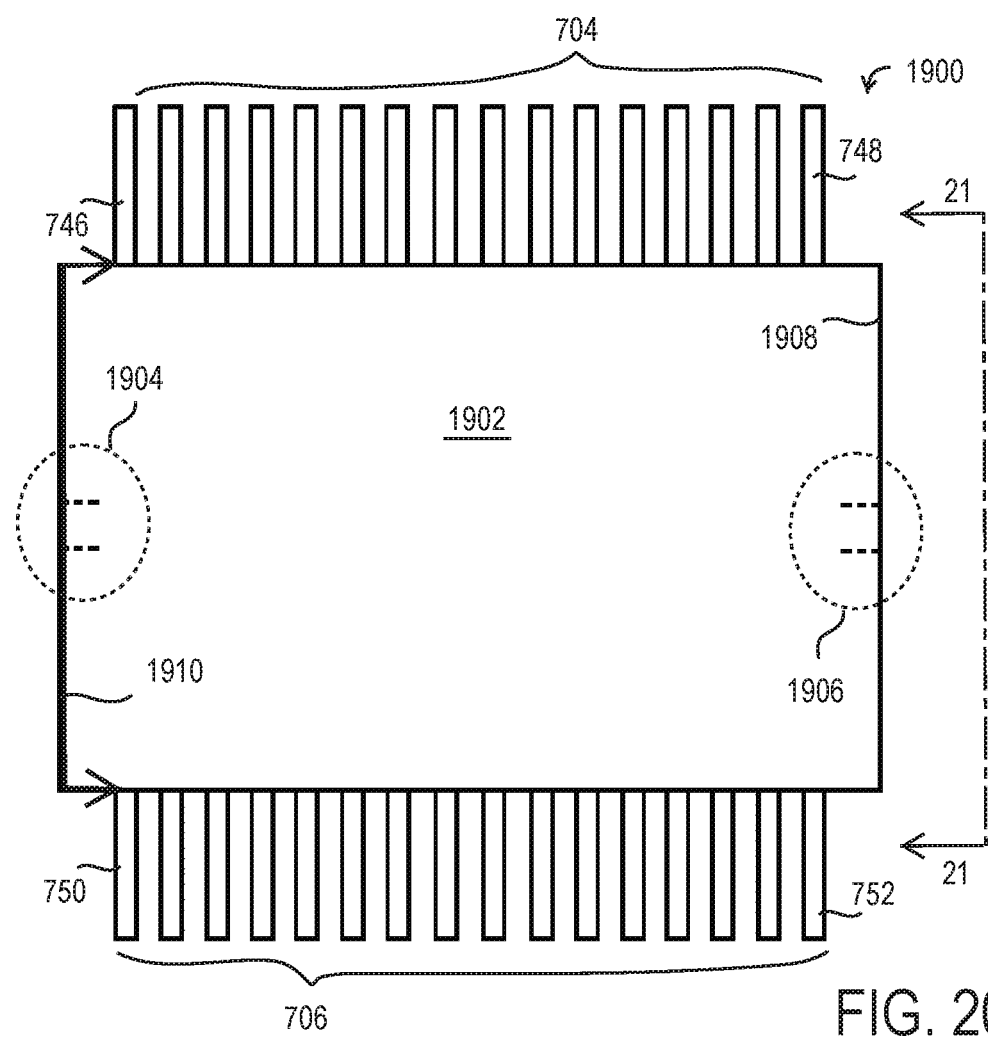
Figure 21:
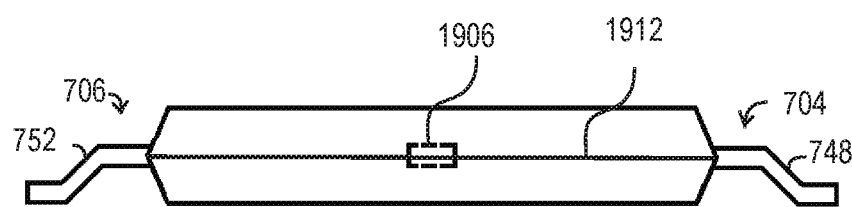

FIG. 20 also shows a top-down view of a resulting semiconductor die package 1900 after the encapsulation process forms a package body 1902 on a hybrid lead frame that includes non-conductive tie bar structures like any of those shown in FIG. 16A-16D on a conductive lead frame like that shown in FIG. 7C or 7D, and after a subsequent trim and form process is performed, as discussed above. Portions of the non-conductive tie bar structures 1904 and 1906 remain within package body 1902 after trim and form and singulation processes, which are shown in dotted lines. The remnants of the non-conductive tie bar structures 1904 and 1906 each have a surface exposed at the surface of the package body 1902, where the surface of the remnants 1904 and 1906 are substantially coplanar with the surface of the package body 1902. Since the remnants of the tie bar structures 1904 and 1906 that remain at the surface of the package body 1902 are non-conductive, the outermost leads of the sets of leads 704 and 706 are successfully separated by a minimum creepage distance equivalent to the distance measured between the outermost leads. As shown in FIG. 20, creepage distance 1910 is measured between leads 746 and 750 along package body outline 1908. FIG. 21 shows a head-on end view of the package 1900, with creepage distance 1912 measured between leads 748 and 752.

It is also noted that while leads 704 and 706 are shown as gull wing shaped leads in FIGS. 19A, 19B, and 21, leads 704 and 706 may include J-shaped leads or other shaped leads in other embodiments. Leads 704 and 706 may be attached to a printed circuit board (PCB) or other suitable chip carrier.

By now it should be appreciated that there has been provided a hybrid lead frame including a conductive lead frame having non-conductive tie bar structures, which achieves a creepage distance that corresponds to a distance between a pair of outermost leads. The hybrid lead frame includes conductive retention tabs to which a non-conductive tie bar structure is attached, where at least a portion of the non-conductive tie bar structure extends into the package body perimeter, while the conductive retention tabs remain outside of the package body perimeter.

In one embodiment of the present disclosure, a lead frame for a packaged semiconductor device is provided, which includes a row of lead fingers, wherein an outer end of each lead finger is connected to a leaded side of the lead frame; a package body perimeter that indicates placement of a package body of the packaged semiconductor device, wherein an inner end of each lead finger falls within the package body perimeter; a retention tab that protrudes from an interior edge of a non-leaded side of the lead frame, wherein the retention tab falls outside of the package body perimeter; and a non-conductive tie bar structure attached to the retention tab, wherein the non-conductive tie bar structure falls within the package body perimeter.

One aspect of the above embodiment provides that the retention tab has a half-etched portion, and an end of the non-conductive tie bar structure is attached to the half-etched portion.

Another aspect of the above embodiment provides that a side of the package body perimeter closest to the retention tab is parallel to and immediately adjacent to an outer edge of the retention tab.

Another aspect of the above embodiment provides that a side of the package body perimeter closest to the retention tab is parallel to and offset from a plane formed by an outer edge of the retention tab by an offset distance.

Another aspect of the above embodiment provides that the retention tab is one of a pair of retention tabs that extends from the interior edge, and the pair of retention tabs are laterally separated from one another by a gap distance.

Another aspect of the above embodiment provides that the non-conductive tie bar structure includes one or more locking holes.

Another aspect of the above embodiment provides that the lead frame further includes: a die pad arm, wherein the die pad arm falls within the package body perimeter and the non-conductive tie bar structure is further attached to the die pad arm.

Another aspect of the above embodiment provides that the non-conductive tie bar structure includes at least one of thermal adhesive tape, plastic, organic polymers, inorganic polymers, polyimides, elastomers, and glass fabric.

Another aspect of the above embodiment provides that the lead frame further includes: a second retention tab that protrudes from an opposite interior edge of the lead frame, wherein the second retention tab falls outside of the package body perimeter; and a second non-conductive tie bar structure attached to the second retention tab, wherein the second non-conductive tie bar structure falls within the package body perimeter.

In another embodiment of the present disclosure, a lead frame for a packaged semiconductor device is provided, which includes: a die pad; a row of lead fingers separate from and extending away from the die pad; a frame structure that surrounds the die pad and the row of lead fingers, wherein each lead finger is connected to a first interior edge of the frame structure; at least one retention tab that protrudes from a second interior edge of the frame structure toward the die pad; and a non-conductive tie bar structure attached to the at least one retention tab, wherein the non-conductive tie bar structure extends from the at least one retention tab toward the die pad.

One aspect of the above embodiment provides that the first interior edge and the second interior edge are perpendicular to one another, and the second interior edge is a non-leaded edge of the frame structure.

Another aspect of the above embodiment provides that the lead frame further includes: a die pad arm, wherein the die pad is connected to the first interior edge of the frame structure via the die pad arm, and the non-conductive tie bar structure is further attached to the die pad arm.

Another aspect of the above embodiment provides that the at least one retention tab has a half-etched portion, and at least one end of the non-conductive tie bar structure is attached to the half-etched portion.

Another aspect of the above embodiment provides that the non-conductive tie bar structure includes one or more locking structures.

In another embodiment of the present disclosure, a packaged electronic device is provided, which includes: an electronic component attached to a flag of a lead frame; a package body formed around the electronic component and the flag; a first row of leads extending from the package body on a first side and a second row of leads extending from the package body on a second side of the package body, the second side opposing the first side; and a non-conductive tie bar structure embedded in the package body and having at least one end surface that is exposed at a surface on a third side of the package body.

One aspect of the above embodiment provides that the non-conductive tie bar structure includes one or more pieces of non-conductive material.

Another aspect of the above embodiment provides that the non-conductive tie bar structure includes one or more locking holes.

Another aspect of the above embodiment provides that the electronic component includes one of a semiconductor die, a passive device, a relay, a resistor, an inductor, a capacitor, a diode, a power transistor, and an oscillator.

Another aspect of the above embodiment provides that an outermost lead of the first row of leads is separated from an outermost lead of the second row of leads by a creepage distance measured along the surface of the package body, and the creepage distance is equal to or larger than 8.0 mm.

Another aspect of the above embodiment provides that the packaged electronic device further includes: a second non-conductive tie bar structure embedded in the package body and having at least one end surface that is exposed at the surface of the package body on a fourth side of the package body, the fourth side opposing the third side.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication or semiconductor die packaging, which are not significant for the stated purpose or value.

Although the invention is described herein with reference to specific embodiments, various modifications and changes can be made without departing from the scope of the present invention as set forth in the claims below. For example, additional or fewer non-conductive structures may be implemented in the lead frame of either FIG. 7A or 7B. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A lead frame for a packaged semiconductor device, the lead frame comprising:
   a row of lead fingers, wherein an outer end of each lead finger is connected to a leaded side of the lead frame;
   a package body perimeter that indicates where edges of a package body of the packaged semiconductor device will be formed upon encapsulation, wherein an inner end of each lead finger falls within the package body perimeter;
   a retention tab that protrudes from an interior edge of a non-leaded side of the lead frame, wherein the retention tab falls outside of the package body perimeter; and
   a non-conductive tie bar structure attached to the retention tab, wherein the non-conductive tie bar structure falls within the package body perimeter.

2. The lead frame of claim 1, wherein
   the retention tab has a half-etched portion, and
   an end of the non-conductive tie bar structure is attached to the half-etched portion.

3. The lead frame of claim 1, wherein
   a side of the package body perimeter closest to the retention tab is parallel to and immediately adjacent to an outer edge of the retention tab.

4. The lead frame of claim 1, wherein
   a side of the package body perimeter closest to the retention tab is parallel to and offset from a plane formed by an outer edge of the retention tab by an offset distance.

5. The lead frame of claim 1, wherein
   the retention tab is one of a pair of retention tabs that extends from the interior edge, and
   the pair of retention tabs are laterally separated from one another by a gap distance.

6. The lead frame of claim 1, wherein
   the non-conductive tie bar structure includes one or more locking holes.

7. The lead frame of claim 1, further comprising:
   a die pad arm, wherein the die pad arm falls within the package body perimeter and the non-conductive tie bar structure is further attached to the die pad arm.

8. The lead frame of claim 1, wherein
   the non-conductive tie bar structure comprises at least one of thermal adhesive tape, plastic, organic polymers, inorganic polymers, polyimides, elastomers, and glass fabric.

9. The lead frame of claim 1, further comprising:
   a second retention tab that protrudes from an opposite interior edge of the lead frame, wherein the second retention tab falls outside of the package body perimeter; and
   a second non-conductive tie bar structure attached to the second retention tab, wherein the second non-conductive tie bar structure falls within the package body perimeter.

10. A lead frame for a packaged semiconductor device, the lead frame comprising:
    a die pad;
    a row of lead fingers separate from and extending away from the die pad;
    a frame structure that surrounds the die pad and the row of lead fingers, wherein each lead finger is connected to a first interior edge of the frame structure;
    at least one retention tab that protrudes from a second interior edge of the frame structure toward the die pad; and
    a non-conductive tie bar structure attached to the at least one retention tab, wherein the non-conductive tie bar structure extends from the at least one retention tab toward the die pad, and wherein the non-conductive tie bar structure is located within a package body perimeter which indicates where edges of a package body of the packaged semiconductor device will be formed upon encapsulation.

11. The lead frame of claim 10, wherein
    the first interior edge and the second interior edge are perpendicular to one another, and
    the second interior edge is a non-leaded edge of the frame structure.

12. The lead frame of claim 10, further comprising:
a die pad arm, wherein
   the die pad is connected to the first interior edge of the frame structure via the die pad arm, and
   the non-conductive tie bar structure is further attached to the die pad arm.

13. The lead frame of claim 10, wherein
the at least one retention tab has a half-etched portion, and
at least one end of the non-conductive tie bar structure is attached to the half-etched portion.

14. The lead frame of claim 10, wherein
the non-conductive tie bar structure includes one or more locking structures.

15. A packaged electronic device comprising:
an electronic component attached to a flag of a lead frame;
a package body formed around the electronic component and the flag;
a first row of leads extending from the package body on a first side and a second row of leads extending from the package body on a second side of the package body, the second side opposing the first side; and
a non-conductive tie bar structure embedded in the package body and having at least one end surface that is exposed at a surface on a third side of the package body.

16. The packaged electronic device of claim 15, wherein the non-conductive tie bar structure comprises one or more pieces of non-conductive material.

17. The packaged electronic device of claim 15, wherein the non-conductive tie bar structure comprises one or more locking holes.

18. The packaged electronic device of claim 15, wherein the electronic component comprises one of a semiconductor die, a passive device, a relay, a resistor, an inductor, a capacitor, a diode, a power transistor, and an oscillator.

19. The packaged electronic device of claim 15, wherein
an outermost lead of the first row of leads is separated from an outermost lead of the second row of leads by a creepage distance measured along the surface of the package body, and
the creepage distance is equal to or larger than 8.0 mm.

20. The packaged electronic device of claim 15, further comprising:
a second non-conductive tie bar structure embedded in the package body and having at least one end surface that is exposed at the surface of the package body on a fourth side of the package body, the fourth side opposing the third side.

\* \* \* \* \*